(12) United States Patent
Steinfield et al.

(10) Patent No.: US 6,332,677 B1
(45) Date of Patent: Dec. 25, 2001

(54) STABLE SUBSTRATE STRUCTURE FOR A WIDE SWATH NOZZLE ARRAY IN A HIGH RESOLUTION INKJET PRINTER

(75) Inventors: Steven W. Steinfield, San Diego; Brian J. Keefe, La Jolla; Winthrop D. Childers, San Diego; Donald G. Harris, Escondido; Majid Azmoon, Poway, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/395,379

(22) Filed: Sep. 14, 1999

Related U.S. Application Data

(63) Continuation of application No. 08/893,775, filed on Jul. 11, 1997, now Pat. No. 5,984,464, which is a continuation of application No. 08/319,894, filed on Oct. 6, 1994, now Pat. No. 5,648,806, which is a continuation-in-part of application No. 08/179,866, filed on Jan. 11, 1994, now Pat. No. 5,625,396, which is a continuation of application No. 07/862,086, filed on Apr. 2, 1992, now Pat. No. 5,278,584, said application No. 08/319,894, is a continuation-in-part of application No. 08/145,261, filed on Oct. 29, 1993, now Pat. No. 5,949,453.

(51) Int. Cl.⁷ .................................................. B41J 2/175
(52) U.S. Cl. .................................................. 347/87
(58) Field of Search .......................... 347/85, 86, 87, 347/40, 48, 55

(56) References Cited

U.S. PATENT DOCUMENTS

| | | | |
|---|---|---|---|
| 4,312,009 | 1/1982 | Lange | 347/51 |
| 4,502,060 | 2/1985 | Rankin et al. | 347/65 |
| 4,558,333 | 12/1985 | Sugitani et al. | 347/65 |
| 4,587,534 | 5/1986 | Saito et al. | 347/56 |
| 4,611,219 | 9/1986 | Sugitani et al. | 347/40 |
| 4,638,328 | 1/1987 | Drake et al. | 347/63 |
| 4,638,337 | 1/1987 | Torpey | 347/62 |
| 4,683,481 | 7/1987 | Johnson | 347/65 |
| 4,695,854 | 9/1987 | Cruz-Uribe | 347/40 |
| 4,712,172 | 12/1987 | Kiyohara et al. | 347/60 |
| 4,734,717 | 3/1988 | Rayfield | 347/40 |
| 4,746,935 | * 5/1988 | Allen | 347/98 |
| 4,791,440 | 12/1988 | Eldridge et al. | 347/58 |
| 4,847,630 | 7/1989 | Bhaskar et al. | 347/63 |
| 4,896,171 | 1/1990 | Ito | 347/47 |
| 4,942,408 | 7/1990 | Braun | 347/63 |
| 4,999,650 | 3/1991 | Braun | 347/58 |
| 5,040,004 | 8/1991 | Dunn et al. | 347/86 |
| 5,059,989 | 10/1991 | Eldridge et al. | 347/63 |
| 5,189,787 | 3/1993 | Reed et al. | 347/50 |
| 5,198,834 | 3/1993 | Childers et al. | 347/47 |
| 5,208,605 | * 5/1993 | Drake | 347/15 |
| 5,305,015 | 4/1994 | Schantz et al. | 347/47 |
| 5,420,627 | * 5/1995 | Keefe et al. | 347/87 |
| 5,450,113 | * 9/1995 | Childers et al. | 347/87 |
| 5,684,518 | * 11/1997 | Nobel et al. | 347/50 |

FOREIGN PATENT DOCUMENTS

| | | | |
|---|---|---|---|
| 0 495 648 A1 | 7/1992 | (EP) | B41J/2/05 |
| 0 564 069 A3 | 10/1993 | (EP) | B41J/2/16 |
| 0 580 283 A3 | 1/1994 | (EP) | B41J/2/16 |
| 0 593 175 A3 | 4/1994 | (EP) | B41J/2/16 |
| 2 134 041 A | 8/1984 | (GB) | B41J/3/04 |

* cited by examiner

Primary Examiner—N. Le
Assistant Examiner—Michael Nghiem

(57) ABSTRACT

An inkjet printhead includes a compact substrate of increased stability and structural integrity to provide a high resolution 600 dot-per-inch nozzle array having a one-half inch swath. A plurality of ink vaporization chambers are respectively aligned with the nozzles in two longitudinal columns, one column extending longitudinally along one edge of the substrate and a second column extending longitudinally along an opposite edge of the substrate, with ink feed channels communicating through an ink passage from an underside of the substrate around both edges of the substrate to the vaporization chambers. The ink feed channels have thereby been eliminated from the central portion of the substrate, and replaced by the ink feed channels at the edges of the substrate.

17 Claims, 27 Drawing Sheets

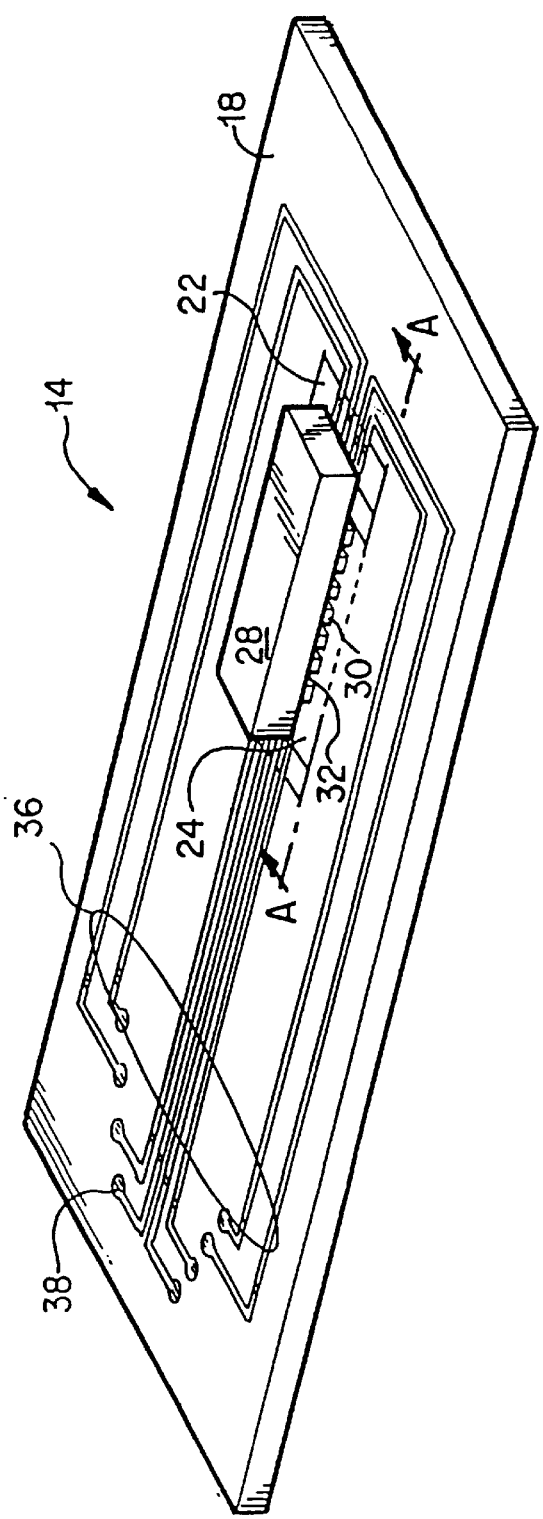
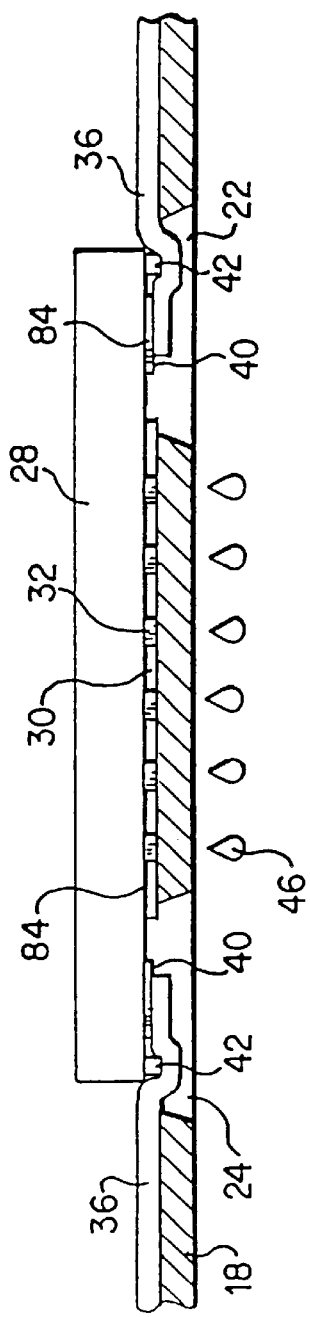
FIG. 5
FIG. 6

SUBSTRATE SCHEMATICS & DATA

| APPROX. Ω | | APPROXIMATE WIDTH IN MICRONS |
|---|---|---|
| 1 | ADDRESS BUS | 400 |
| 2 | GROUND BUS | 1150 |
| 4 | MOS FET TRANSISTORS | 1800 |
| 2 | PRIMITIVE SELECT BUS | 360 |
| 28 | INK CHANNEL ARCH. | 414 |
| N/A | MISCELLANEOUS SPACING | 110 |
| N/A | DIE MARGIN | 200 |
| 36 | TOTALS | 4434 |
| | STEPPING DISTANCE FOR CUTTING WAFER IN X DIRECTION | 4434 |

DIE MARGIN
INK CHANNEL ARCHITECTURE
PRIMITIVE BUS
MOS FET's
GROUND BUS
ADDRESS BUS ———CENTER———
GROUND BUS
MOS FET's
PRIMITIVE BUS
INK CHANNEL ARCHITECTURE
DIE MARGIN

FIG. 21

STABLE SUBSTRATE STRUCTURE FOR A WIDE SWATH NOZZLE ARRAY IN A HIGH RESOLUTION INKJET PRINTER

CROSS-REFERENCE TO RELATED APPLICATIONS

This application is a continuation of copending Ser. No. 08/893,775 filed Jul. 11, 1997, now U.S. Pat. No. 5,984,464, which is a continuation of Ser. No. 08/319,894 filed Oct. 6, 1994, now U.S. Pat. No. 5,648,806, which is a CIP of Ser. No. 08/179,866 filed Jan. 11, 1994, now U.S. Pat. No. 5,625,396, which is a continuation of Ser. No. 07/862,086 filed Apr. 2, 1992, now U.S. Pat. No. 5,278,584. The aforesaid Ser. No. 08/319,894 is also a CIP of Ser. No. 08/145,261 filed Oct. 29, 1993, now U.S. Pat. No. 5,949,453.

This application also relates to the subject matter disclosed in the following U.S. Pat. No. 5,949,453 and U.S. Applications:

U.S. application Ser. No. 07/864,822 now U.S. Pat. No. 5,420,627, filed Apr. 2, 1992, entitled "Improved Inkjet Printhead;"

U.S. application Ser. No. 07/864,930, filed Apr. 2, 1992, entitled "Structure and Method for Aligning a Substrate With Respect to Orifices in an Inkjet Printhead;" now issued as U.S. Pat. No. 5,297,331.

U.S. application Ser. No. 08/236,915, filed Apr. 29, 1994, entitled "Thermal Inkjet Printer Printhead now U.S. Pat. No. 5,635,968;"

U.S. application Ser. No. 08/235,610 now U.S. Pat. No. 5,635,966, filed Apr. 29, 1994, entitled "Edge Feed Ink Delivery Thermal Inkjet Printhead Structure and Method of Fabrication;"

U.S. Pat. No. 4,719,477 to Hess, entitled "Integrated Thermal Ink Jet Printhead and Method of Manufacture;"

U.S. Pat. No. 5,122,812 to Hess, et al., entitled "Thermal Inkjet Printhead Having Driver Circuitry Thereon and Method for Making the Same"; and U.S. Pat. No. 5,159,353 to Fasen, et al., entitled "Thermal Inkjet Printhead Structure and Method for Making the Same"; and U.S. application filed herewith, entitled "Inkjet Printhead Architecture for High Speed and High Resolution Printing", U.S. application Ser. No. 08/319,986, filed Oct. 6, 1994, now U.S. Pat. No. 5,648,805; and U.S. application filed herewith, entitled "Inkjet Printhead Architecture for High Frequency Operation", U.S. application Ser. No. 08/319,404, filed Oct. 6, 1994, now U.S. Pat. No. 5,604,519; and U.S. application filed herewith, entitled "High Density Nozzle Array for Inkjet Printhead", U.S. application Ser. No. 08/319,892 filed Oct. 6, 1994, now U.S. Pat. No. 5,638,701; and U.S. application filed herewith, entitled "Inkjet Printhead Architecture for High Speed Ink Firing Chamber Refill", U.S. application Ser. No. 08/320,684, filed Oct. 6, 1994 now U.S. Pat. No. 5,563,642; and U.S. application filed herewith, entitled "Ink Channel Structure Inkjet Printhead", U.S. application Ser. No. 08/319,893 now U.S. Pat. No. 5,594,481; and U.S. application filed herewith, entitled "Compact Inkjet Substrate with a Minimal Number of Circuit Interconnects Located at the End Thereof", U.S. application Ser. No. 08/319,895 filed Oct. 6, 1994 now U.S. Pat. No. 5,568,171; and U.S. application filed herewith, entitled "Self-Cooling Structure for Inkjet Substrate with High Density High Frequency Firing Chambers and Multiple Substrate Circuitry Elements", U.S. application Ser. No. 08/648,471 filed May 15, 1996 now U.S. Pat. No. 5,619,236; and U.S. application filed herewith, entitled "Compact Inkjet Stbstrate with Centrally Located Circuitry and Edge Feed Ink Channels", U.S. application Ser. No. 08/319,405 filed Oct. 6, 1994 now U.S. Pat. No. 5,648,804.

The above patents and applications are assigned to the present assignee and are incorporated herein by reference.

BACKGROUND OF THE INVENTION

The present invention generally relates to inkjet and other types of printers and, more particularly, to the printhead portion of an inkjet printer.

Inkjet print cartridges operate by causing a small volume of ink to vaporize and be ejected from a firing chamber through one of a plurality of orifices so as to print a dot of ink on a recording medium such as paper. Typically, the orifices are arranged in one or more linear nozzle arrays. The properly sequenced ejection of ink from each orifice causes characters or other images to be printed in a swath across the paper.

An inkjet printhead generally includes ink channels to supply ink from an ink reservoir to each vaporization chamber (i.e., firing chamber) proximate to an orifice; a nozzle member in which the orifices are formed; and a silicon substrate containing a series of thin film resistors, one resistor per vaporization chamber.

To print a single dot of ink in a thermal inkjet printer, an electrical current from an external power supply is passed through a selected thin film resistor. The resistor is then heated, in turn superheating a thin layer of the adjacent ink within a vaporization chamber, causing explosive vaporization, and, consequently, causing a droplet of ink to be ejected through an associated orifice onto the paper.

In an inkjet printhead, described in U.S. Pat. No. 4,683,481 to Johnson, entitled "Thermal Ink Jet Common-Slotted Ink Feed Printhead," ink is fed from an ink reservoir to the various vaporization chambers through an elongated hole formed in the substrate. The ink then flows to a manifold area, formed in a barrier layer between the substrate and a nozzle member, then into a plurality of ink channels, and finally into the various vaporization chambers. This design may be classified as a "center" feed design, with side electrical interconnects to a flex-circuit along the full length of the substrate. Ink is fed to the vaporization chambers from a central location then distributed outward into the vaporization chambers which contain the firing resistors. Some disadvantages of this type of ink feed design are that manufacturing time is required to make the hole in the substrate, and the required substrate area is increased by at least the area of the hole and also by extra substrate at both ends of the hole to provide structural integrity. Also, once the hole is formed, the substrate is relatively fragile, making handling more difficult. Such prior printhead design limited the ability of printheads to have compact stable substrates with wide swath high nozzle densities and the lower operating temperatures required for increased resolution and throughput. Print resolution depends on the density of ink-ejecting orifices and heating resistors formed on the cartridge printhead substrate. Modern circuit fabrication techniques allow the placement of substantial numbers of resistors on a single printhead substrate. However, the number of resistors applied to the substrate is limited by the number and location of the conductive components used to electrically connect the printhead to external driver circuitry in the printer unit. Specifically, an increasingly large number of firing resistors requires a correspondingly large number of interconnection pads, leads, grounds and the like. This increase in components and interconnects and the resulting increase in substrate size causes greater manufacturing/production costs, increases the probability that defects will occur during the manufacturing process, and increases the heat generated during high frequency operation.

BRIEF SUMMARY OF THE INVENTION

In order to solve the aforementioned problems, thermal inkjet printheads have been developed which efficiently incorporate pulse driver circuitry directly on the printhead substrate with the firing resistors. The incorporation of driver circuitry on the printhead substrate in this manner reduces the number of interconnect components needed to electrically connect the printhead to the printer unit. This results in improved production and operating efficiency.

To further produce high-efficiency integrated printing systems, significant research has developed improved transistor structures and unique methods for integrating them into high resolution compact substrates with good structural integrity and improved heat control characteristics. The integration of driver components, address lines, ground lines and firing resistors onto a common substrate is based on specialized, multi-layer connective circuitry so that the driver transistors can communicate with the firing resistors and other portions of the printing system. Typically, this connective circuitry involves a plurality of separate conductive layers.

To increase resolution and print quality, the printhead nozzles are placed closer together and are fed through an "edge feed" ink channel architecture. Both firing resistors and the associated orifices are placed closer together along the full length of the outer edges of the substrate, with the related circuitry primarily located in the middle portion of the substrate. To increase printer throughput, the width of the printing swath is increased by placing more nozzles on the print head to create a nozzle array which prints a one-half inch print swath.

More specifically, the invention contemplates a compact substrate of increased stability and structural integrity in order to achieve high resolution of 600 dots-per-inch in a nozzle array having a one-half inch swath. A plurality of ink vaporization chambers are respectively aligned with a total of three hundred nozzles in two longitudinal columns, one column extending longitudinally along one edge of the substrate and a second column extending longitudinally along an opposite edge of the substrate. Ink feed channels communicate through an ink passage from an underside of the substrate around both edges of the substrate to the vaporization channels. The ink feed channels have thereby been eliminated from the central portion of the substrate and replaced by the inkfeed channels at the edges of the substrate, so that structural stability is achieved without unduly extending both ends of the substrate. FIG. 14 is a view of one arrangement of orifices and the associated heater resistors on a printhead.

FIG. 1 is a perspective view of an inkjet print cartridge according to one embodiment of the present invention.

FIGS. 2A, 2B, and 2C provide a perspective view of an inkjet print cartridge according to one embodiment of the present invention.

FIG. 5 is a perspective view of the back surface of the TAB head assembly of FIG. 4 with a silicon substrate mounted thereon and the conductive leads attached to the substrate.

FIG. 6 is a side elevational view in cross-section taken along line A—A in FIG. 5 illustrating the attachment of conductive leads to electrodes on the silicon substrate.

FIG. 21 shows the substrate schematics and data taken in a direction along the width of the substrate.

DETAILED DESCRIPTION OF THE PREFERRED EMBODIMENTS

Generally speaking the invention provides an improved ink delivery system between an ink reservoir and ink ejection chambers in an inkjet printhead operating at high firing frequencies. In a preferred embodiment, a barrier layer containing ink channels and vaporization chambers is located between a rectangular substrate and a nozzle member containing an array of orifices. The substrate contains two linear arrays of heater elements, and each orifice in the nozzle member is associated with a vaporization chamber and heater element. The ink channels in the barrier layer have ink entrances generally running along two opposite edges of the substrate so that ink flowing around the edges of the substrate gain access to the ink channels and to the vaporization chambers. Piezoelectric elements can be used instead of heater elements.

More particularly, the features of the invention include an ink delivery system for an array of nozzle orifices in a print cartridge comprising an ink reservoir; a substrate having a plurality of individual ink firing chambers with an ink firing element in each chamber; an ink channel connecting said reservoir with said ink firing chambers, said channel including a primary channel connected at a first end with said reservoir and at a second end to a secondary channel; a separate inlet passage for each firing chamber connecting said secondary channel with said firing chamber for allowing high frequency refill of the firing chamber; a group of said firing chambers in adjacent relationship forming a primitive in which only one firing chamber in said primitive is activated at a time; first circuit means on said substrate connected to said firing elements; and second circuit means on said cartridge connected to said first circuit means, for transmitting firing signals to said ink firing elements at a frequency greater than 9 kHz.

Figure 1:
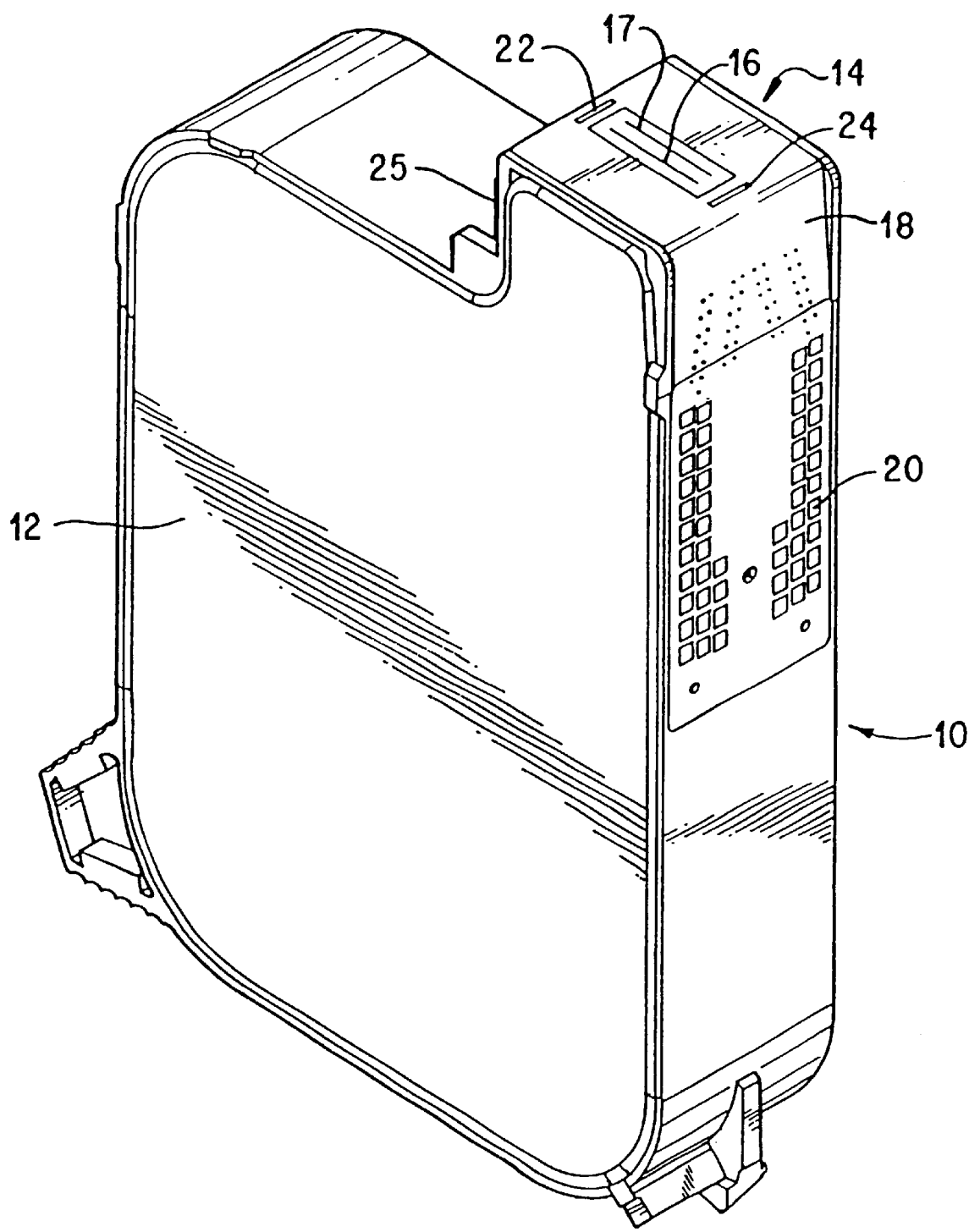

Referring to FIG. 1, reference numeral 10 generally indicates an inkjet print cartridge incorporating a printhead according to one embodiment of the present invention simplified for illustrative purposes. The inkjet print cartridge 10 includes an ink reservoir 12 and a printhead 14, where the printhead 14 is formed using Tape Automated Bonding (TAB). The printhead 14 (hereinafter "TAB head assembly 14") includes a nozzle member 16 comprising two parallel columns of offset holes or orifices 17 formed in a flexible polymer flexible circuit 18 by, for example, laser ablation.

A back surface of the flexible circuit 18 includes conductive traces 36 formed thereon using a conventional photolithographic etching and/or plating process. These conductive traces 36 are terminated by large contact pads 20 designed to interconnect with a printer. The print cartridge 10 is designed to be installed in a printer so that the contact pads 20, on the front surface of the flexible circuit 18, contact printer electrodes providing externally generated energization signals to the printhead.

Windows 22 and 24 extend through the flexible circuit 18 and are used to facilitate bonding of the other ends of the conductive traces 36 to electrodes on a silicon substrate containing heater resistors. The windows 22 and 24 are filled with an encapsulant to protect any underlying portion of the traces and substrate.

In the print cartridge 10 of FIG. 1, the flexible circuit 18 is bent over the back edge of the print cartridge "snout" and extends approximately one half the length of the back wall 25 of the snout. This flap portion of the flexible circuit 18 is needed for the routing of conductive traces 36 which are connected to the substrate electrodes through the far end window 22. The contact pads 20 are located on the flexible circuit 18 which is secured to this wall and the conductive traces 36 are routed over the bend and are connected to the substrate electrodes through the windows 22, 24 in the flexible circuit 18.

Figure 2A:
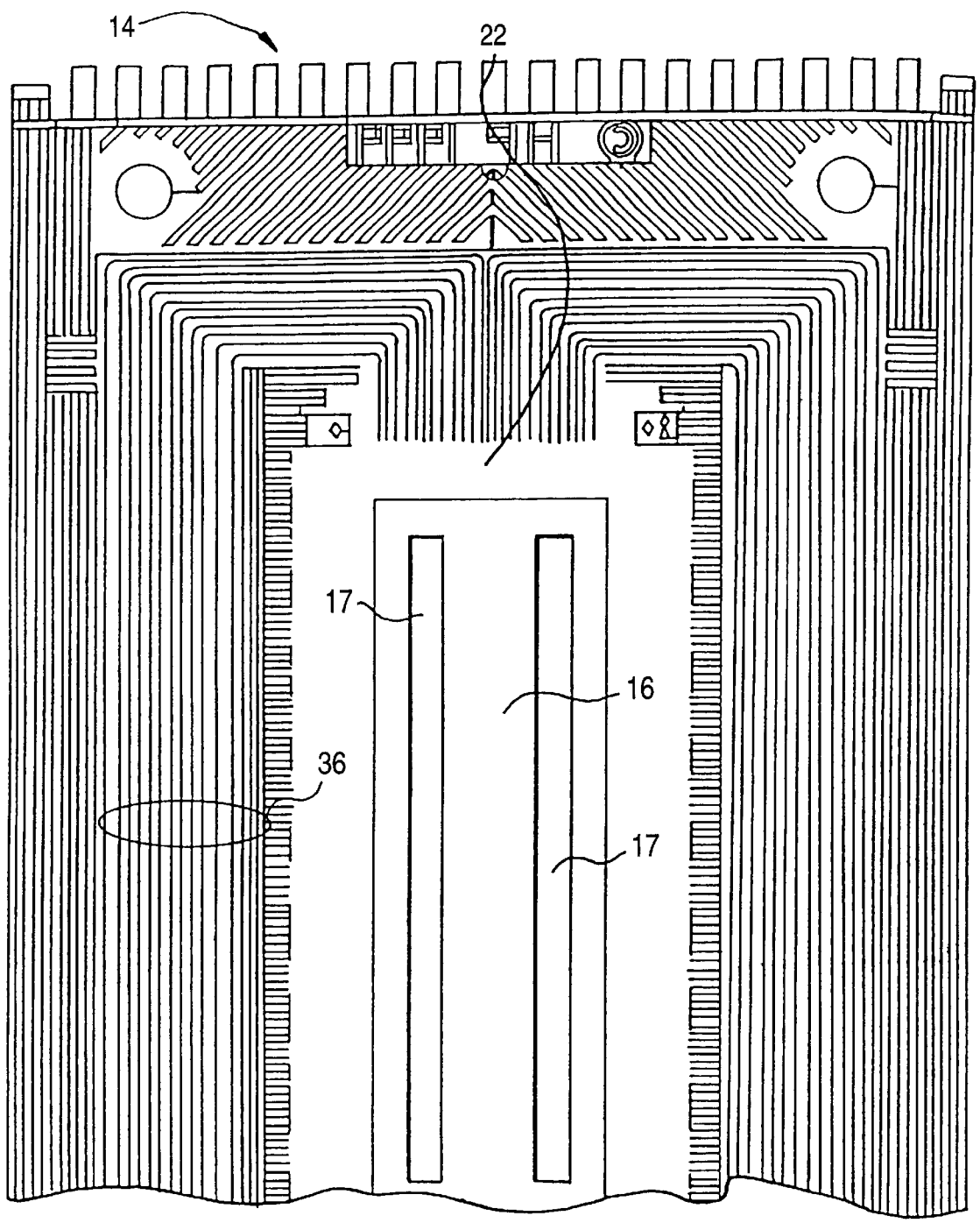
Figure 2B:
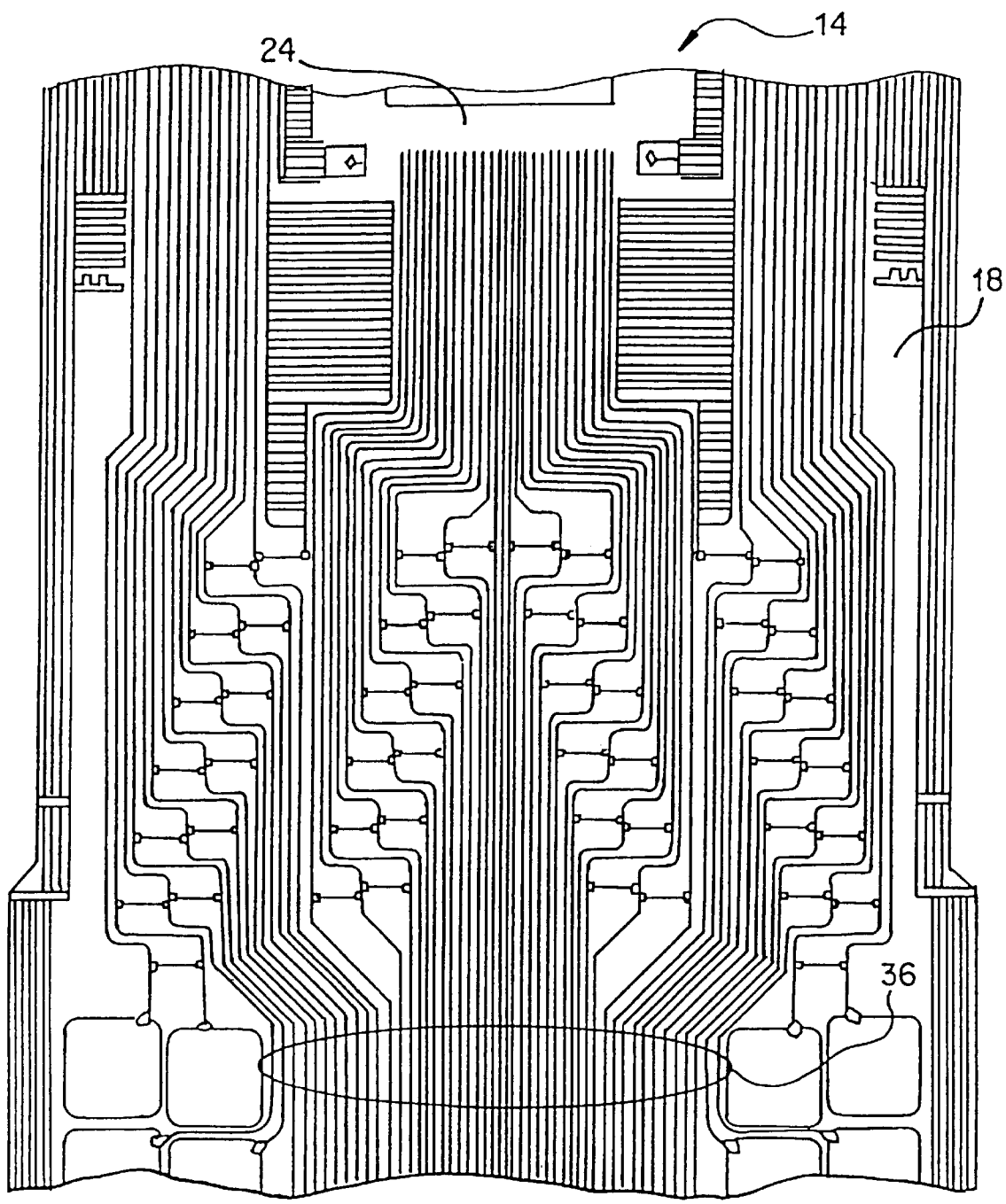
Figure 2C:
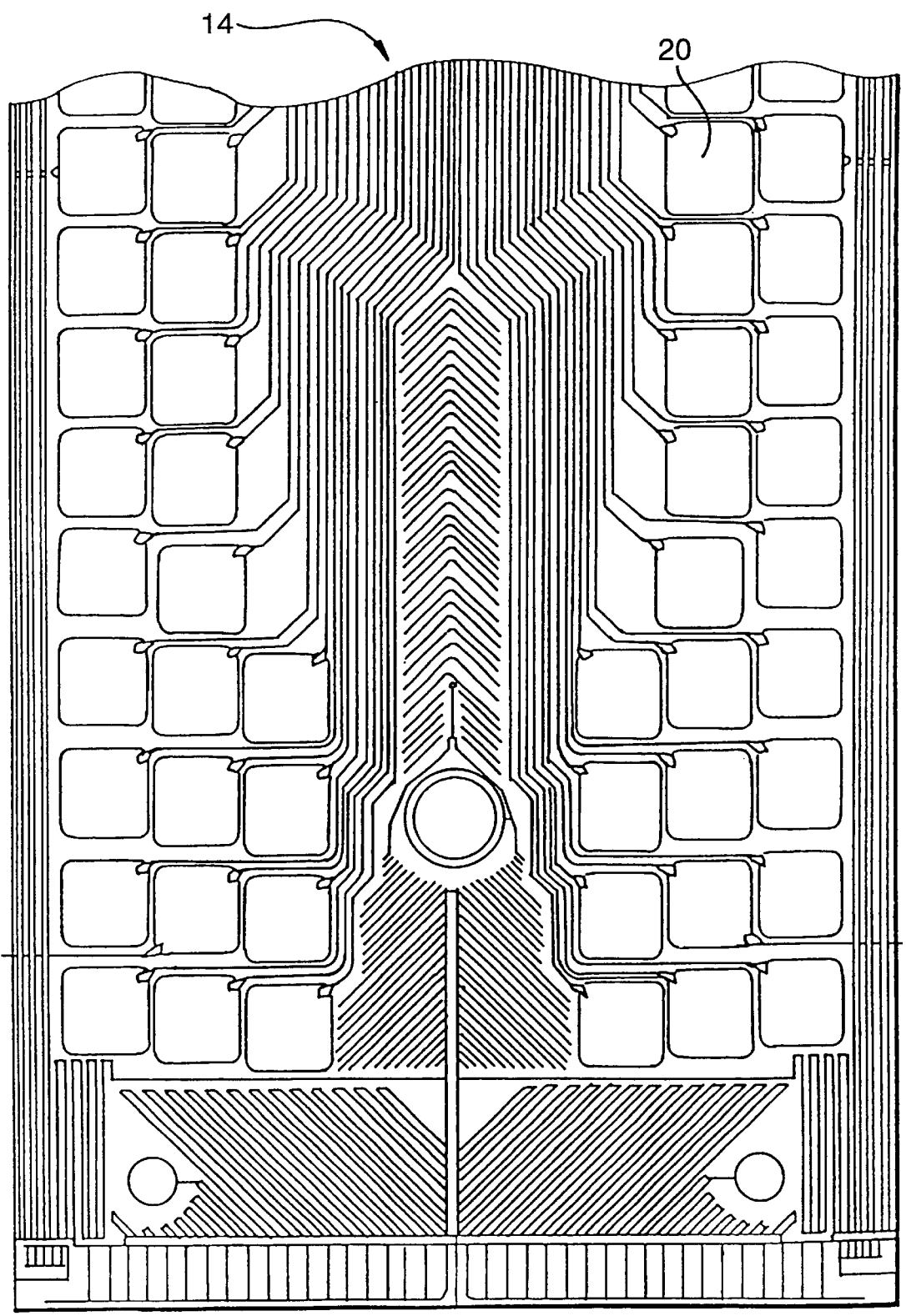

FIGS. 2A, 2B and 2C show a front view of the TAB head assembly 14 of FIG. 1 removed from the print cartridge 10 and prior to windows 22 and 24 in the TAB head assembly 14 being filled with an encapsulant. TAB head assembly 14 has affixed to the back of the flexible circuit 18 a silicon substrate 28 (not shown) containing a plurality of individually energizable thin film resistors. Each resistor is located generally behind a single orifice 17 and acts as an ohmic heater when selectively energized by one or more pulses applied sequentially or simultaneously to one or more of the contact pads 20.

The orifices 17 and conductive traces 36 may be of any size, number, and pattern, and the various figures are designed to simply and clearly show the features of the invention. The relative dimensions of the various features have been greatly adjusted for the sake of clarity.

Figure 14:
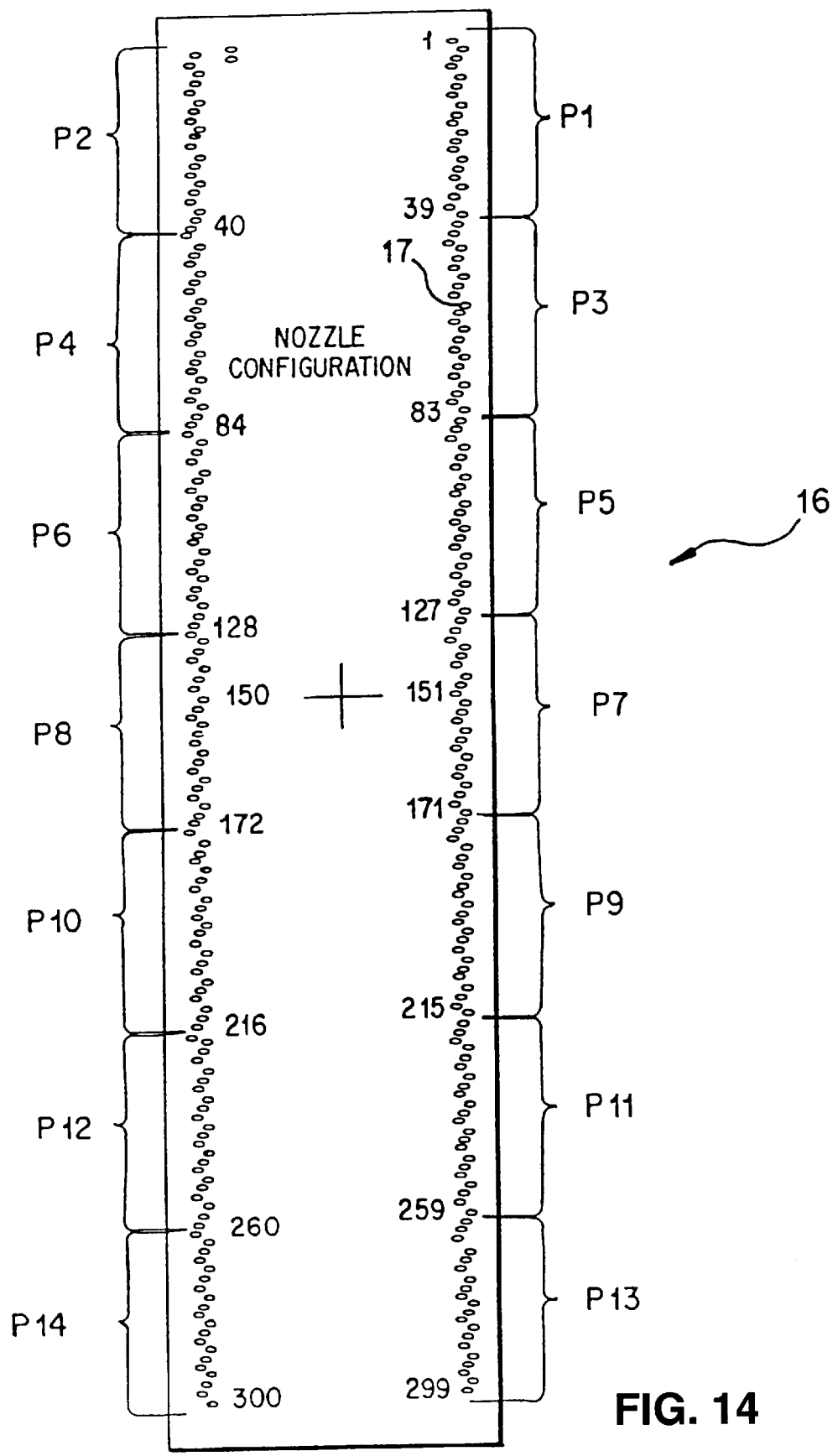
FIG. 14 is a view of one arrangement of orifices and the associated heater resistors on a printhead.

The orifice 17 pattern on the flexible circuit 18 shown in FIG. 2 may be formed by a masking process in combination with a laser or other etching means in a step-and-repeat process, which would be readily understood by one of ordinary skilled in the art after reading this disclosure. FIG. 14, to be described in detail later, provides additional details of this process. Further details regarding TAB head assembly 14 and flexible circuit 18 are provided below.

Figure 3:
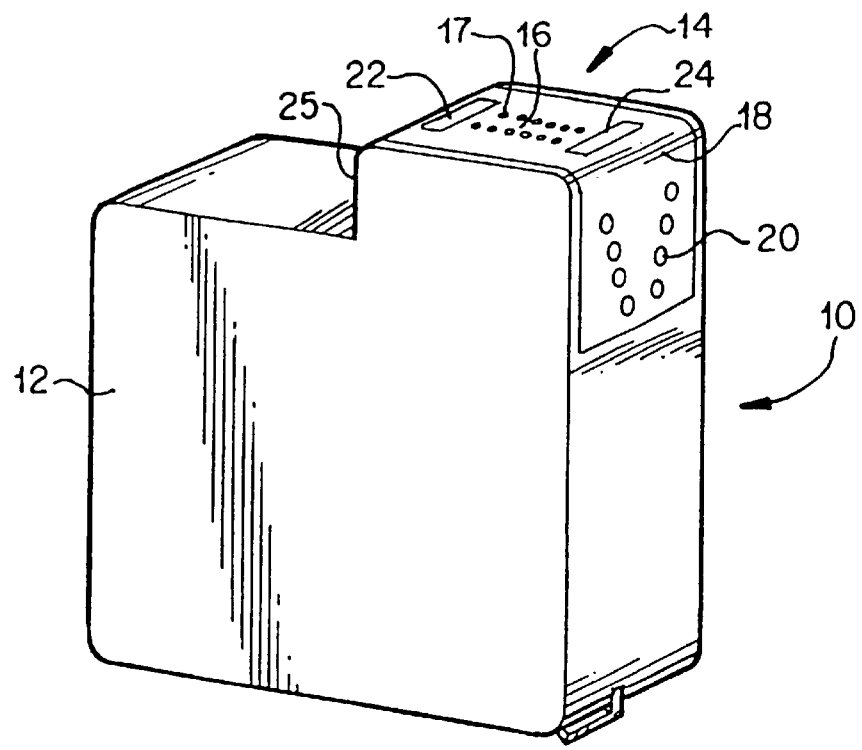
FIG. 3 is a perspective view of an simplified schematic of the inkjet print cartridge of FIG. 1 for illustrative purposes.
Figure 4:
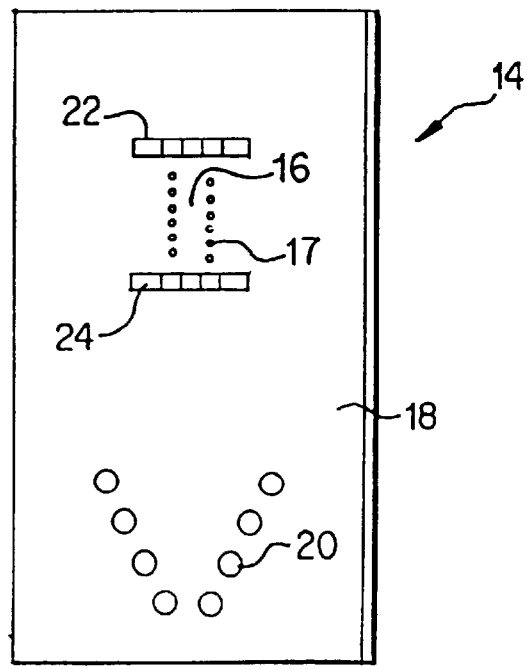
FIG. 4 is a perspective view of the front surface of the Tape Automated Bonding (TAB) printhead assembly (hereinafter "TAB head assembly") removed from the print cartridge of FIG. 3.

FIG. 3 is a perspective view of a simplified schematic of the inkjet print cartridge of FIG. 1 for illustrative purposes. FIG. 4 is a perspective view of the front surface of the Tape Automated Bonding (TAB) printhead assembly (hereinafter "TAB head assembly") removed from the simplified schematic print cartridge of FIG. 3.

Figure 7:
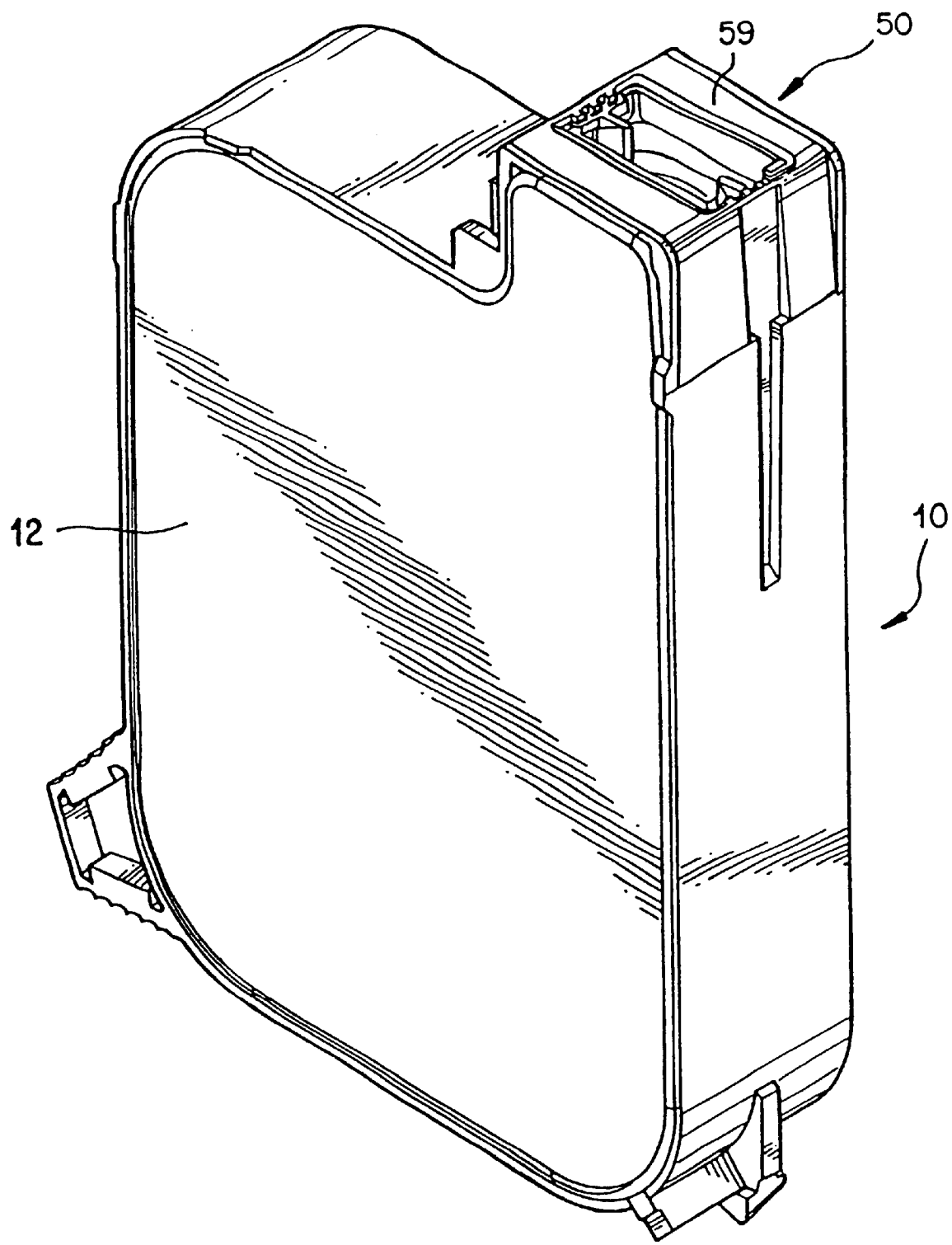
FIG. 7 is a perspective view of the inkjet print cartridge of FIG. 1 with the TAB head assembly removed.

FIG. 5 shows the back surface of the TAB head assembly 14 of FIG. 4 showing the silicon die or substrate 28 mounted to the back of the flexible circuit 18 and also showing one edge of the barrier layer 30 formed on the substrate 28 containing ink channels and vaporization chambers. FIG. 7 shows greater detail of this barrier layer 30 and will be discussed later. Shown along the edge of the barrier layer 30 are the entrances to the ink channels 32 which receive ink from the ink reservoir 12. The conductive traces 36 formed on the back of the flexible circuit 18 terminate in contact pads 20 (shown in FIG. 4) on the opposite side of the flexible circuit 18. The windows 22 and 24 allow access to the ends of the conductive traces 36 and the substrate electrodes 40 (shown in FIG. 6) from the other side of the flexible circuit 18 to facilitate bonding.

FIG. 6 shows a side view cross-section taken along line A—A in FIG. 5 illustrating the connection of the ends of the conductive traces 36 to the electrodes 40 formed on the substrate 28. As seen in FIG. 6, a portion 42 of the barrier layer 30 is used to insulate the ends of the conductive traces 36 from the substrate 28. Also shown in FIG. 6 is a side view of the flexible circuit 18, the barrier layer 30, the windows 22 and 24, and the entrances of the various ink channels 32. Droplets of ink 46 are shown being ejected from orifice holes associated with each of the ink channels 32.

Figure 8:
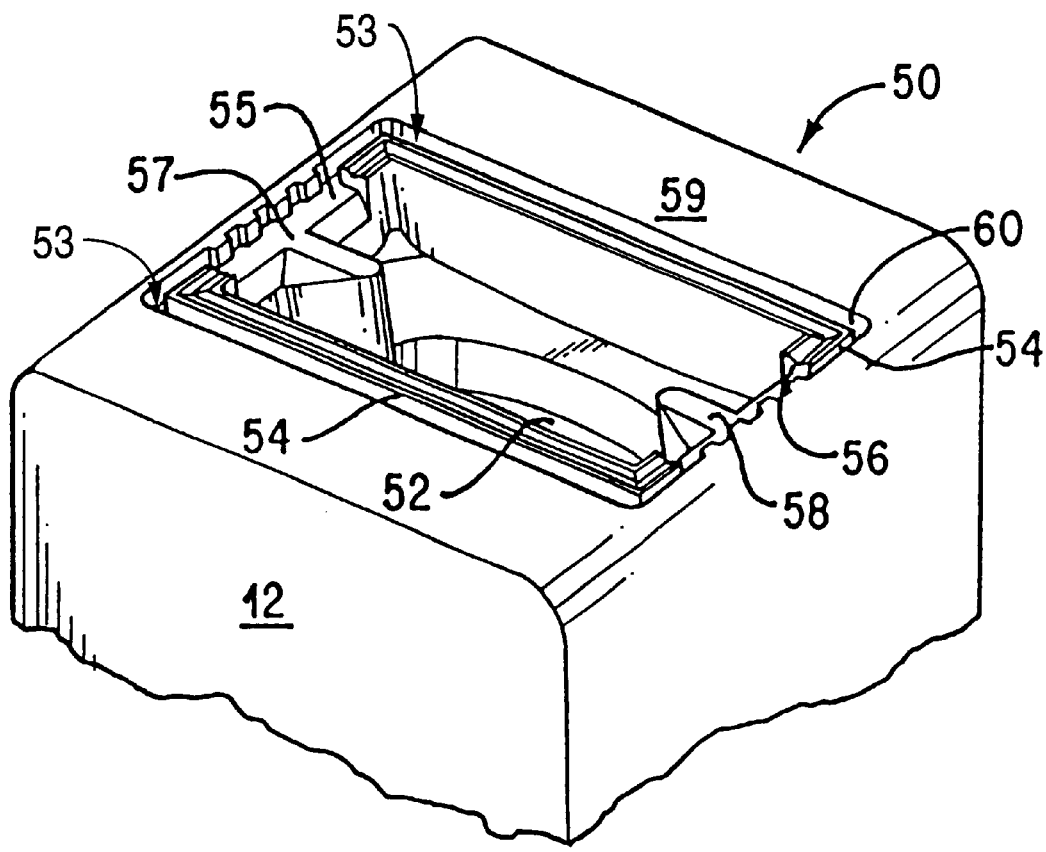
FIG. 8 is a perspective view of the headland area of the inkjet print cartridge of FIG. 7
Figure 9:
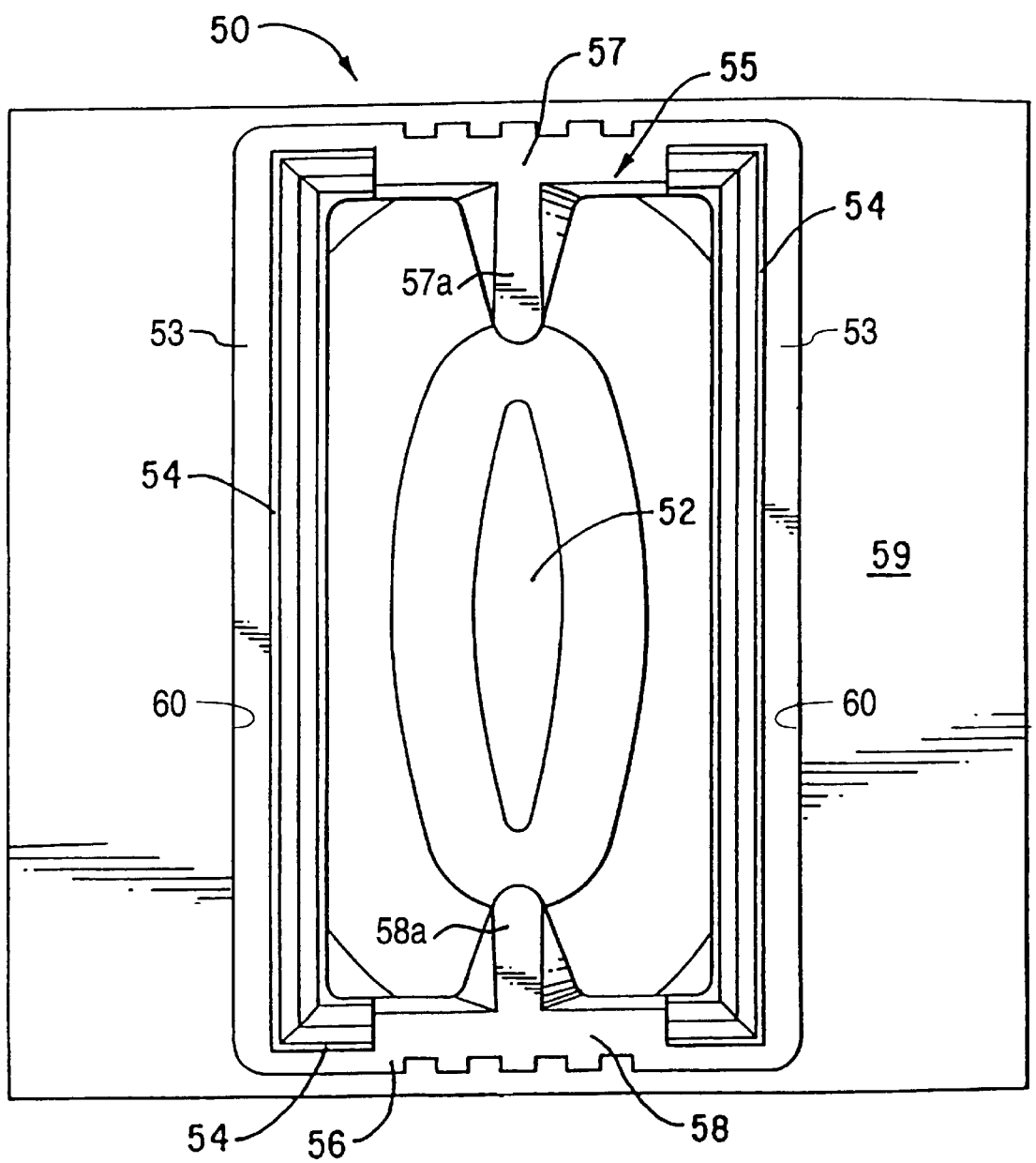
FIG. 9 is a top plan view of the headland area of the inkjet print cartridge of FIG. 7.

FIG. 7 shows the print cartridge 10 of FIG. 1 with the TAB head assembly 14 removed to reveal the headland pattern 50 used in providing a seal between the TAB head assembly 14 and the printhead body. FIG. 8 shows the headland area in enlarged perspective view. FIG. 9 shows the headland area in an enlarged top plan view. The headland characteristics are exaggerated for clarity. Shown in FIGS. 8 and 9 is a central slot 52 in the print cartridge 10 for allowing ink from the ink reservoir 12 to flow to the back surface of the TAB head assembly 14.

The headland pattern 50 formed on the print cartridge 10 is configured so that a bead of epoxy adhesive (not shown) dispensed on the inner raised walls 54 and across the wall openings 55 and 56 (so as to circumscribe the substrate when the TAB head assembly 14 is in place) will form an ink seal between the body of the print cartridge 10 and the back of the TAB head assembly 14 when the TAB head assembly 14 is pressed into place against the headland pattern 50. Other adhesives which may be used include hot-melt, silicone, UV curable adhesive, and mixtures thereof. Further, a patterned adhesive film may be positioned on the headland, as opposed to dispensing a bead of adhesive.

Figure 13:
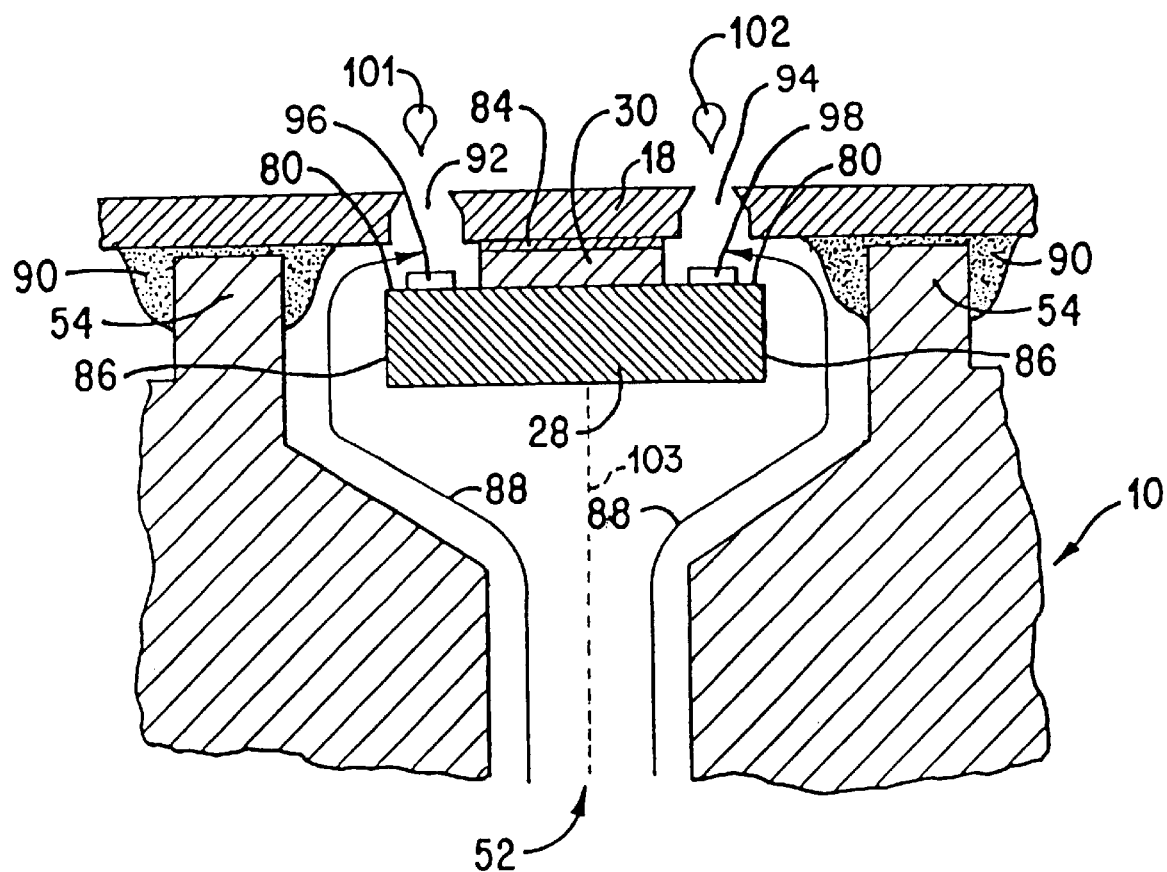
FIG. 13 is a schematic cross-sectional view taken along line B—B of FIG. 10 showing the adhesive seal between the TAB head assembly and the print cartridge as well as the ink flow path around the edges of the substrate.

When the TAB head assembly 14 of FIG. 5 is properly positioned and pressed down on the headland pattern 50 in FIG. 8 after the adhesive (not shown) is dispensed, the two short ends of the substrate 28 will be supported by the surface portions 57 and 58 within the wall openings 55 arid 56. Additional details regarding adhesive 90 are shown in FIG. 13. The configuration of the headland pattern 50 is such that, when the substrate 28 is supported by the surface portions 57 and 58 and adjoining central peninsulas 57a and 58 a, the back surface of the flexible circuit 18 will be slightly above the top of the raised walls 54 and approximately flush with the flat top surface 59 of the print cartridge 10. As the TAB head assembly 14 is pressed down onto the headland 50, the adhesive is squished down. From the top of the inner raised walls 54, the adhesive overspills into the gutter or groove 53 between the inner raised walls 54 and the outer raised wall 60 and overspills somewhat toward the slot 52. From the wall openings 55 and 56, the adhesive squishes inwardly in the direction of slot 52 and squishes outwardly toward the outer raised wall 60, which blocks further outward displacement of the adhesive. The outward displacement of the adhesive not only serves as an ink seal, but encapsulates the conductive traces in the vicinity of the headland 50 from underneath to protect the traces from ink.

Figure 10:
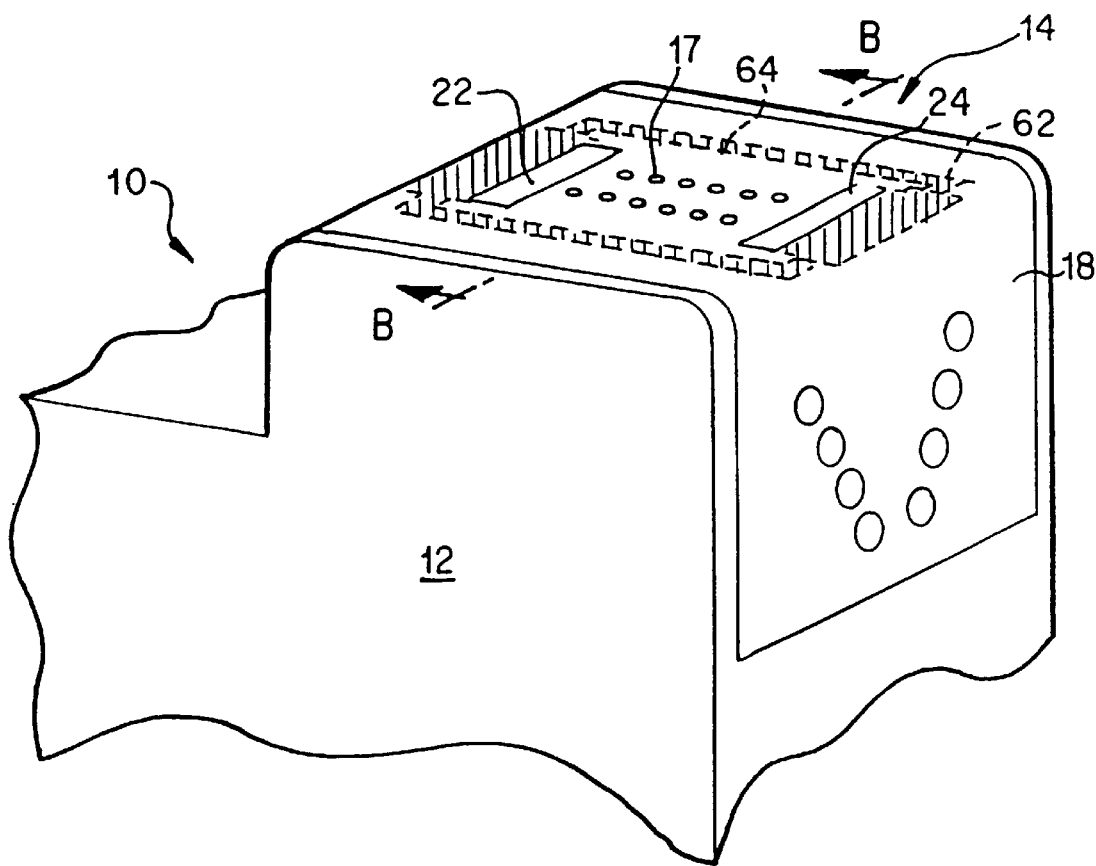
FIG. 10 is a perspective view of a portion of the inkjet print cartridge of FIG. 3 illustrating the configuration of a seal which is formed between the ink cartridge body and the TAB head assembly.

FIG. 10 shows a portion of the completed print cartridge 10 of FIG. 3 illustrating, by cross-hatching, the location of the underlying adhesive 90 (not shown) which forms the seal between the TAB head assembly 14 and the body of the print cartridge 10. In FIG. 10 the adhesive is located generally between the dashed lines surrounding the array of orifices 17, where the outer dashed line 62 is slightly within the boundaries of the outer raised wall 60 in FIG. 7, and the inner dashed line 64 is slightly within the boundaries of the inner raised walls 54 in FIG. 7. The adhesive is also shown being squished through the wall openings 55 and 56 (FIG. 7) to encapsulate the traces leading to electrodes on the substrate. A cross-section of this seal taken along line B—B in FIG. 10 is also shown in FIG. 13, to be discussed later.

This seal formed by the adhesive 90 circumscribing the substrate 28 allows ink to flow from slot 52 and around the sides of the substrate to the vaporization chambers formed in the barrier layer 30, but will prevent ink from seeping out from under the TAB head assembly 14. Thus, this adhesive seal 90 provides a strong mechanical coupling of the TAB head assembly 14 to the print cartridge 10, provides a fluidic seal, and provides trace encapsulation. The adhesive seal is also easier to cure than prior art seals, and it is much easier to detect leaks between the print cartridge body and the printhead, since the sealant line is readily observable. Further details on adhesive seal 90 are shown in FIG. 13.

Figure 11:
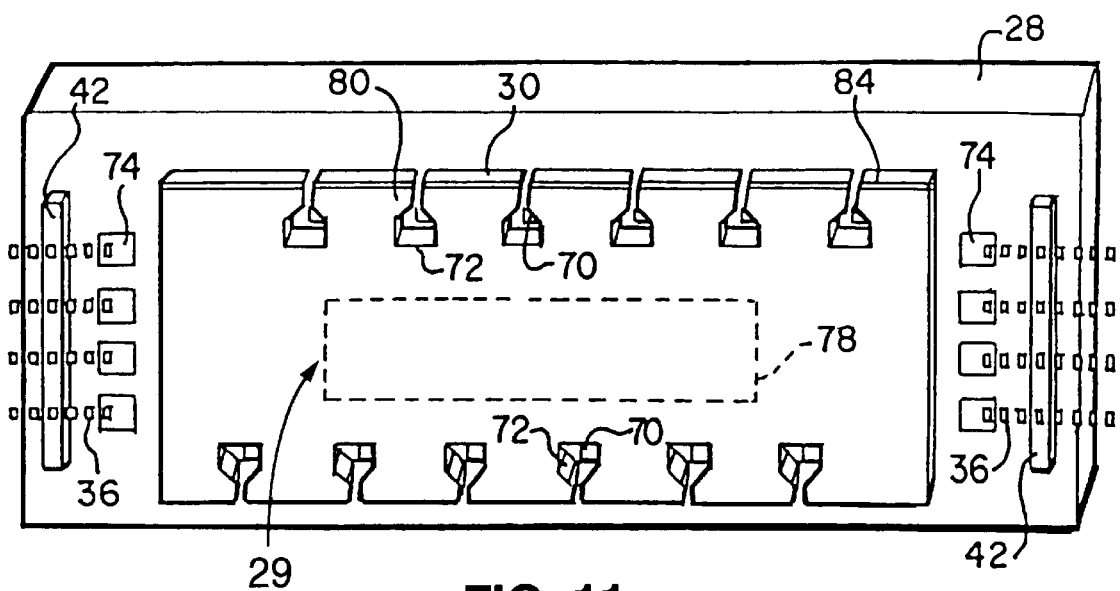
FIG. 11 is a top perspective view of a substrate structure containing heater resistors, ink channels, and vaporization chambers, which is mounted on the back of the TAB head assembly of FIG. 4.

FIG. 11 is a front perspective view of the silicon substrate 28 which is affixed to the back of the flexible circuit 18 in FIG. 5 to form the TAB head assembly 14. Silicon substrate 28 has formed on it, using conventional photolithographic techniques, two rows or columns of thin film resistors 70, shown in FIG. 11 exposed through the vaporization chambers 72 formed in the barrier layer 30.

In one embodiment, the substrate 28 is approximately one-half inch long and contains 300 heater resistors 70, thus enabling a resolution of 600 dots per inch. Heater resistors 70 may instead be any other type of ink ejection element, such as a piezoelectric pump-type element or any other conventional element. Thus, element 70 in all the various figures may be considered to be piezoelectric elements in an alternative embodiment without affecting the operation of the printhead. Also formed on the substrate 28 are electrodes 74 for connection to the conductive traces 36 (shown by dashed lines) formed on the back of the flexible circuit 18.

A demultiplexer 78, shown by a dashed outline in FIG. 11, is also formed on the substrate 28 for demultiplexing the incoming multiplexed signals applied to the electrodes 74 and distributing the signals to the various thin film resistors 70. The demultiplexer 78 enables the use of much fewer electrodes 74 than thin film resistors 70. Having fewer electrodes allows all connections to the substrate to be made from the short end portions of the substrate, as shown in FIG. 4, so that these connections will not interfere with the ink flow around the long sides of the substrate. The demultiplexer 78 may be any decoder for decoding encoded signals applied to the electrodes 74. The demultiplexer has input leads (not shown for simplicity) connected to the electrodes 74 and has output leads (not shown) connected to the various resistors 70. The demultiplexer 78 circuity is discussed in further detail below.

Also formed on the surface of the substrate 28 using conventional photolithographic techniques is the barrier layer 30, which may be a layer of photoresist or some other polymer, in which is formed the vaporization chambers 72 and ink channels 80. A portion 42 of the barrier layer 30 insulates the conductive traces 36 from the underlying substrate 28, as previously discussed with respect to FIG. 4.

In order to adhesively affix the top surface of the barrier layer 30 to the back surface of the flexible circuit 18 shown in FIG. 5, a thin adhesive layer 84 (not shown), such as an uncured layer of poly-isoprene photoresist, is applied to the top surface of the barrier layer 30. A separate adhesive layer may not be necessary if the top of the barrier layer 30 can be otherwise made adhesive. The resulting substrate structure is then positioned with respect to the back surface of the flexible circuit 18 so as to align the resistors 70 with the orifices formed in the flexible circuit 18. This alignment step also inherently aligns the electrodes 74 with the ends of the conductive traces 36. The traces 36 are then bonded to the electrodes 74. This alignment and bonding process is described in more detail later with respect to FIG. 14. The aligned and bonded substrate/flexible circuit structure is then heated while applying pressure to cure the adhesive layer 84 and firmly affix the substrate structure to the back surface of the flexible circuit 18.

Figure 12:
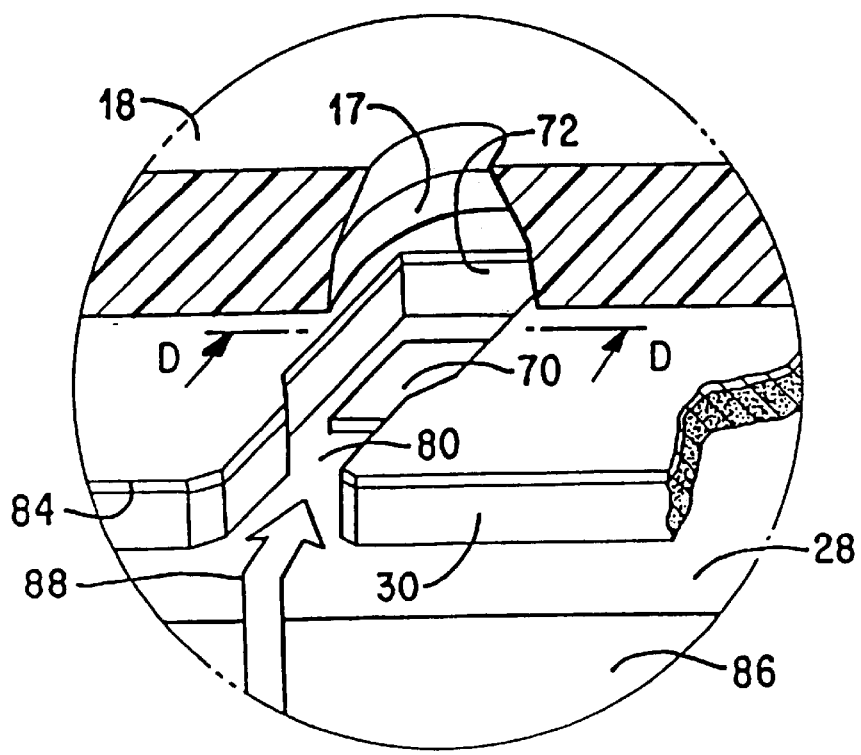
FIG. 12 is a top perspective view, partially cut away, of a portion of the TAB head assembly showing the relationship of an orifice with respect to a vaporization chamber heater resistor, and an edge of the substrate.

FIG. 12 is an enlarged view of a single vaporization chamber 72, thin film resistor 70, and frustum shaped orifice 17 after the substrate structure of FIG. 11 is secured to the back of the flexible circuit 18 via the thin adhesive layer 84. A side edge of the substrate 28 is shown as edge 86. In operation, ink flows from the ink reservoir 12 around the side edge 86 of the substrate 28, and into the ink channel 80 and associated vaporization chamber 72, as shown by the arrow 88. Upon energization of the thin film resistor 70, a thin layer of the adjacent ink is superheated, causing explosive vaporization and, consequently, causing a droplet of ink to be ejected through the orifice 17. The vaporization chamber 72 is then refilled by capillary action.

In a preferred embodiment, the barrier layer 30 is approximately 1 mils thick, the substrate 28 is approximately 20 mils thick, and the flexible circuit 18 is approximately 2 mils thick.

Shown in FIG. 13 is a side elevational view cross-section taken along line B—B in FIG. 10 showing a portion of the adhesive seal 90, applied to the inner raised wall 54 and wall openings 55, 56, surrounding the substrate 28 and showing the substrate 28 being adhesively secured to a central portion of the flexible circuit 18 by the thin adhesive layer 84 on the top surface of the barrier layer 30 containing the ink channels and vaporization chambers 92 and 94. A portion of the plastic body of the printhead cartridge 10, including raised walls 54 shown in FIGS. 7 and 8, is also shown.

FIG. 13 also illustrates how ink 88 from the ink reservoir 12 flows through the central slot 52 formed in the print cartridge 10 and flows around the edges 86 of the substrate 28 through ink channels 80 into the vaporization chambers 92 and 94. Thin film resistors 96 and 98 are shown within the vaporization chambers 92 and 94, respectively. When the resistors 96 and 98 are energized, the ink within the vaporization chambers 92 and 94 are ejected, as illustrated by the emitted drops of ink 101 and 102.

The edge feed feature, where ink flows around the edges 86 of the substrate 28 and directly into ink channels 80, has a number of advantages over previous center feed printhead designs which form an elongated central hole or slot running lengthwise in the substrate to allow ink to flow into a central manifold and ultimately to the entrances of ink channels. One advantage is that the substrate or die 28 width can be made narrower, due to the absence of the elongated central hole or slot in a central interior portion 29 of the substrate. Not only can the substrate be made narrower, but the length of the edge feed substrate can be shorter, for the same number of nozzles, than the center feed substrate due to the substrate structure now being less prone to cracking or breaking without the central ink feed hole. This shortening of a substrate die 210 (see FIG. 23) to form the substrate 28 enables a shorter headland 50 in FIG. 8 and, hence, a shorter print cartridge snout. This is important when the print cartridge 10 is installed in a printer which uses one or more pinch rollers below the snout's transport path across the paper to press the paper against the rotatable platen and which also uses one or more rollers (also called star wheels) above the transport path to maintain the paper contact around the platen. With a shorter print cartridge snout, the star wheels can be located closer to the pinch rollers to ensure better paper/roller contact along the transport path of the print cartridge snout. Additionally, by making the substrate smaller, more substrates can be formed per wafer, thus lowering the material cost per substrate.

Other advantages of the edge feed feature are that manufacturing time is saved by not having to etch a slot in the substrate, and the substrate is less prone to breakage during handling. Further, the substrate is able to dissipate more heat, since the ink flowing across the back of the substrate and around the edges of the substrate acts to draw heat away from the back of the substrate.

There are also a number of performance advantages to the edge feed design. Be eliminating the manifold as well as the slot in the substrate, the ink is able to flow more rapidly into the vaporization chambers, since there is less restriction on the ink flow. This more rapid ink flow improves the frequency response of the printhead, allowing higher printing rates from a given number of orifices. Further, the more rapid ink flow reduces crosstalk between nearby vaporization chambers caused by variations in ink flow as the heater elements in the vaporization chambers are fired.

In another embodiment, the ink reservoir contains two separate ink sources, each containing a different color of ink. In this alternative embodiment, the central slot 52 in FIG. 13 is bisected, as shown by the dashed line 103, so that each side of the central slot 52 communicates with a separate ink source. Therefore, the left linear array of vaporization chambers can be made to eject one color of ink, while the right linear array of vaporization chambers can be made to eject a different color of ink. This concept can even be used to create a four color printhead, where a different ink reservoir feeds ink to ink channels along each of the four sides of the substrate. Thus, instead of the two-edge feed design discussed above, a four-edge design would be used, preferably using a square substrate for symmetry.

In order to make a finished printhead, the TAB head assembly is positioned on the print cartridge 10, and the previously described adhesive seal 90 is formed to firmly secure the nozzle member to the print cartridge, provide an ink-proof seal around the substrate between the nozzle member and the ink reservoir, and encapsulate the traces in the vicinity of the headland so as to isolate the traces from the ink. Peripheral points on the flexible TAB head assembly are then secured to the plastic print cartridge 10 by a conventional melt-through type bonding process to cause the polymer flexible circuit 18 to remain relatively flush with the surface of the print cartridge 10, as shown in FIG. 1.

To increase resolution and print quality, the printhead nozzles must be placed closer together. This requires that both heater resistors and the associated orifices be placed closer together. Referring to FIG. 14, as discussed above, the orifices 17 in the nozzle member 16 of the TAB head assembly are generally arranged in two major columns of orifices 17 as shown in FIG. 14. For clarity of understanding, the orifices 17 are conventionally assigned a number as shown, starting at the top right as the TAB head assembly as viewed from the external surface of the nozzle member 16 and ending in the lower left, thereby resulting in the odd numbers being arranged in one column and even numbers being arranged in the second column. Of course, other numbering conventions may be followed, but the description of the firing order of the orifices 17 associated with this numbering system has advantages. The orifices/resistors in each column are spaced $\frac{1}{300}$ of an inch apart in the long direction of the nozzle member. The orifices and resistors in one column are offset from the orifice/resistors in the other column in the long direction of the nozzle member by $\frac{1}{600}$ of an inch, thus, providing 600 dots per inch (dpi) printing.

Figure 22:
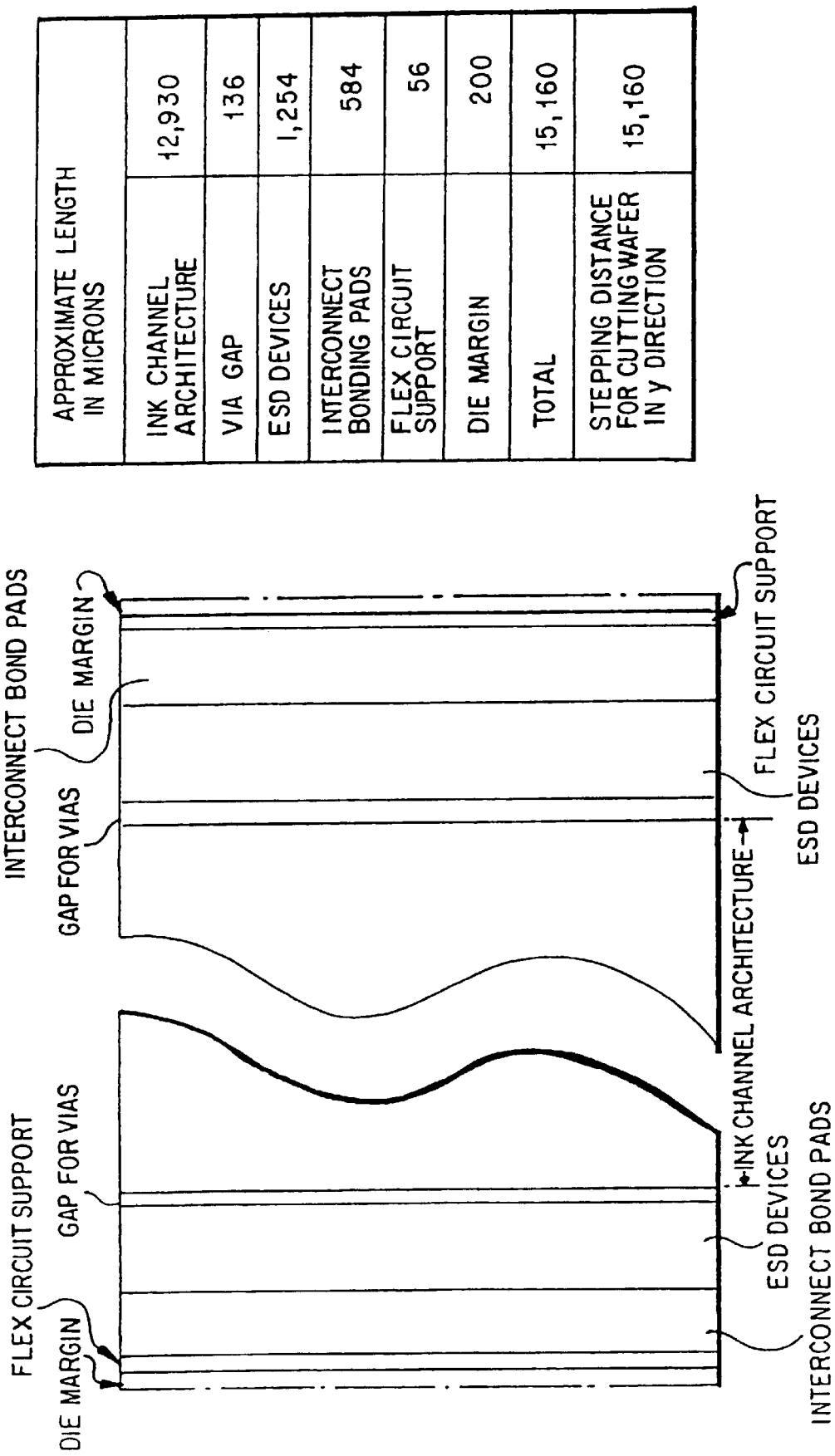
FIG. 22 shows the substrate schematics and data taken in a direction along the length of the substrate.

In one embodiment of the present invention the orifices 17, while aligned in two major columns as described, are further arranged in an offset pattern within each column to match the offset heater resistors 70 disposed in the substrate 28 as illustrated in FIG. 14. Within a single row or column of resistors, a small offset E is provided between resistors. This small offset E allows adjacent resistors 70 to be fired at slightly different times when the TAB head assembly is scanning across the recording medium to further minimize cross-talk effects between adjacent vaporization chambers 130. Thus, although the resistors are fired at twenty two different times, the offset allows the ejected ink drops from different nozzles to be placed in the same horizontal position on the print media. The resistors 70 are coupled to electrical drive circuitry (not shown in FIG. 14) and are organized in groups of fourteen primitives which consist of four primitives of twenty resistors (P1, P2, P13 and P14) and ten primitives of twenty two resistors for a total of 300 resistors. The fourteen resistor primitives (and associated orifices) are shown in FIG. 22.

Figure 15:
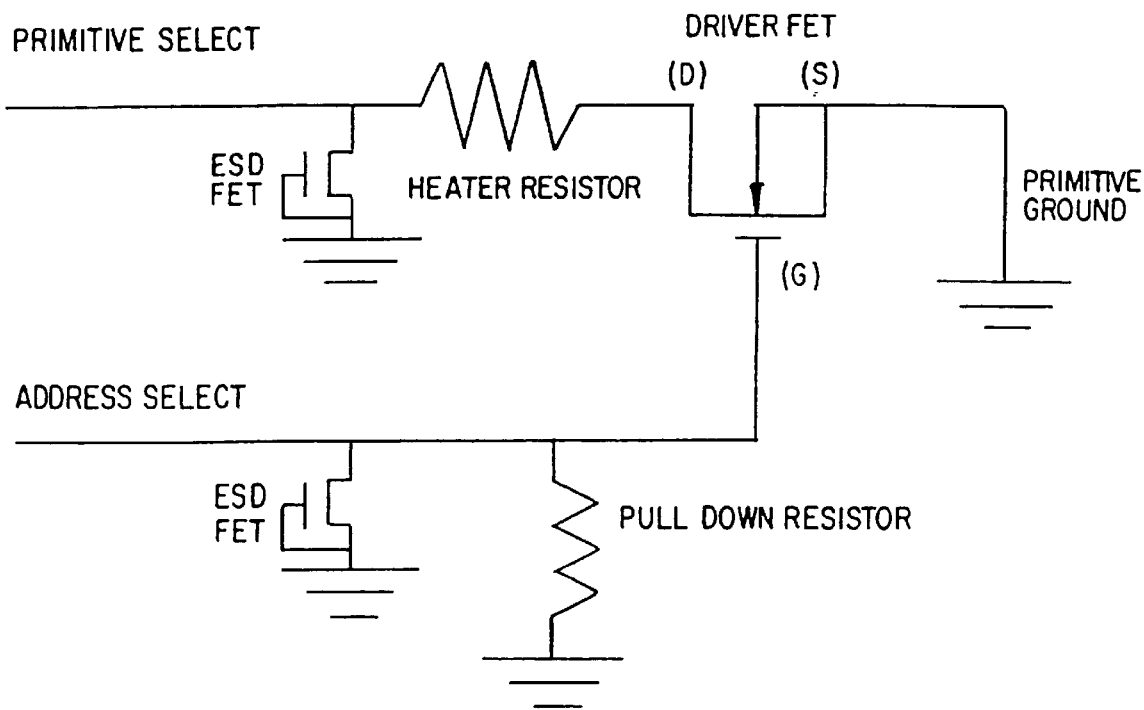
FIG. 15 is a schematic diagram of one heater resistor and its associated address line, drive transistor, primitive select line and ground line.

As described, the firing heater resistors 70 of the preferred embodiment are organized as fourteen primitive groups of twenty or twenty-two resistors. It can be seen that each resistor (numbered 1 through 300 and corresponding to the orifices 17 of FIG. 14) is controlled by its own FET drive transistor, which shares its control input Address Select (A1–A22) with thirteen other resistors. Each resistor is tied to nineteen or twenty-one other resistors by a common node Primitive Select (PS1–PS14). Consequently, firing a particular resistor requires applying a control voltage at its "Address Select" terminal and an electrical power source at its "Primitive Select" terminal. Only one Address Select line is enabled at one time. This ensures that the Primitive Select and Group Return lines supply current to at most one resistor at a time. Otherwise, the energy delivered to a heater resistor would be a function of the number of resistors 70 being fired at the same time. FIG. 15 is a schematic diagram of an individual heater resistor and its FET drive transistor. As shown in FIG. 15, Address Select and Primitive Select lines also contain transistors for draining unwanted electrostatic discharge and pull down resistors to place all unselected addresses in an off state. Table I shows the correlation between the firing resistor/orifice and the Address Select and Primitive Select Lines.

combination of the Primitive Select lines. Primitive Select lines (instead of Address Select lines) are used in the preferred embodiment to control the pulse width. Disabling Address Select lines while the drive transistors are conducting high current can cause avalanche breakdown and consequent physical damage to MOS transistors. Accordingly, the Address Select lines are "set" before power is applied to the Primitive Select lines, and conversely, power is turned off before the Address Select lines are changed.

Figure 16:
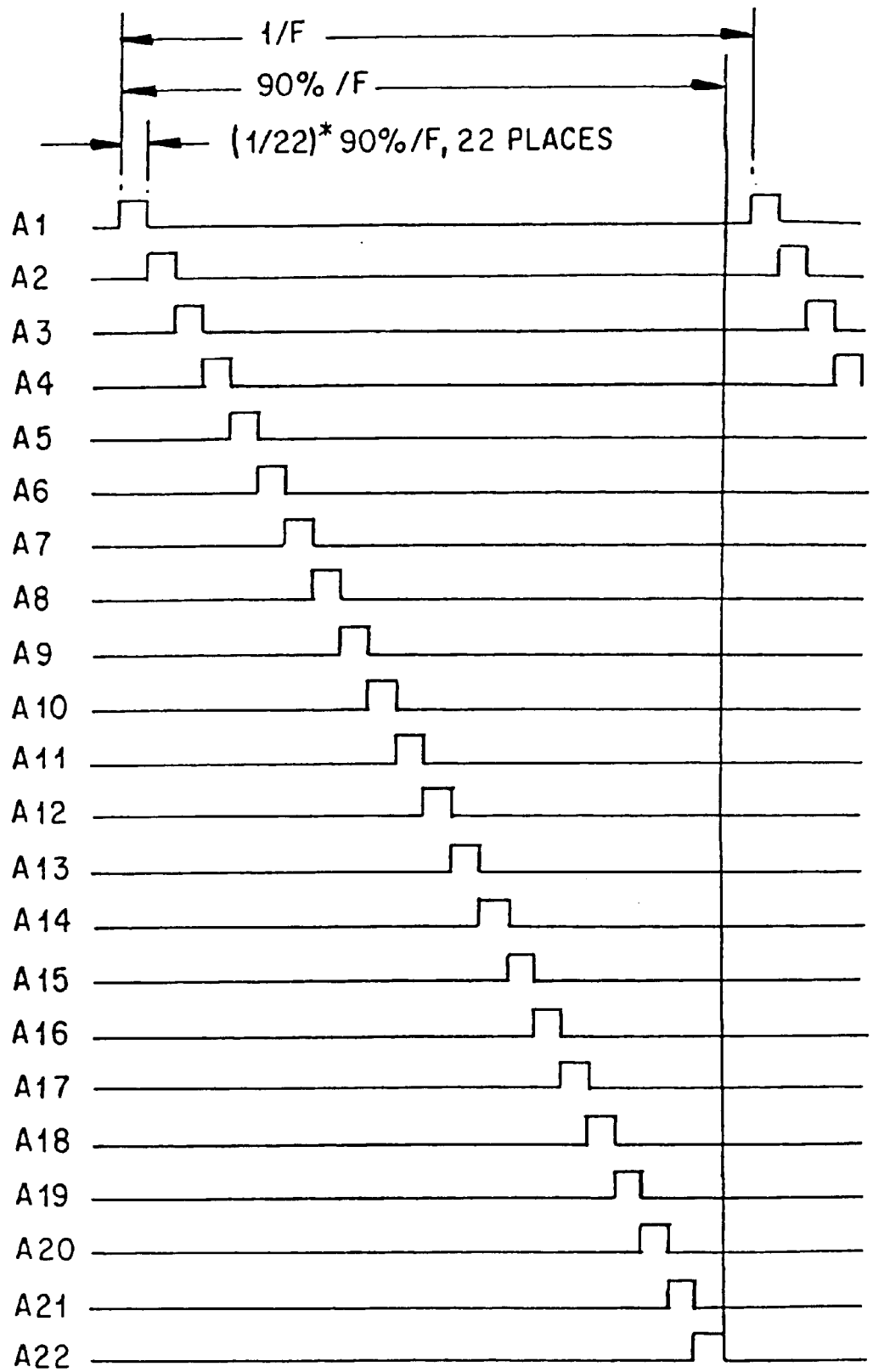
FIG. 16 is a schematic diagram of the firing sequence for the address select lines when the printer carriage is moving from left to right.

In response to print commands from the printer, each primitive is selectively fired by powering the associated primitive select interconnection. To provide uniform energy per heater resistor only one resistor is energized at a time per primitive. However, any number of the primitive selects may be enabled concurrently. Each enabled primitive select thus delivers both power and one of the enable signals to the driver transistor. The other enable signal is an address signal provided by each address select line only one of which is active at a time. Each address select line is tied to all of the switching transistors so that all such switching devices are conductive when the interconnection is enabled. Where a primitive select interconnection and an address select line for a heater resistor are both active simultaneously, that particular heater resistor is energized. Thus, firing a particular resistor requires applying a control voltage at its "Address Select" terminal and an electrical power source at its "Primitive Select" terminal. Only one Address Select line is enabled at one time. This ensures that the Primitive Select and Group Return lines supply current to at most one resistor at a time. Otherwise, the energy delivered to a heater resistor would be a function of the number of resistors 70 being fired at the same time. FIG. 16 shows the firing sequence when the print carriage is scanning from left to right. The firing sequence is reversed when scanning from right to left. The

TABLE I

Nozzle Number by Address Select and Primitive Select Lines

|  | P1 | P2 | P3 | P4 | P5 | P6 | P7 | P8 | P9 | P10 | P11 | P12 | P13 | P14 |
|---|---|---|---|---|---|---|---|---|---|---|---|---|---|---|
| A1 | 1 |  | 45 | 42 | 89 | 86 | 133 | 130 | 177 | 174 | 221 | 21B | 265 | 262 |
| A2 | 7 | 4 | 51 | 48 | 95 | 92 | 139 | 136 | 183 | 180 | 227 | 224 | 271 | 268 |
| A3 | 13 | 10 | 57 | 54 | 101 | 98 | 145 | 142 | 129 | 186 | 233 | 230 | 277 | 274 |
| A4 | 19 | 16 | 63 | 60 | 107 | 104 | 151 | 148 | 195 | 192 | 239 | 236 | 283 | 280 |
| A5 | 25 | 22 | 63 | 66 | 113 | 110 | 157 | 154 | 201 | 198 | 245 | 242 | 289 | 286 |
| A6 | 31 | 28 | 75 | 72 | 119 | 118 | 163 | 160 | 207 | 204 | 251 | 248 | 295 | 292 |
| A7 | 37 | 34 | 81 | 78 | 125 | 122 | 169 | 166 | 213 | 204 | 257 | 254 |  | 298 |
| A8 |  | 40 | 43 | 84 | 87 | 125 | 131 | 172 | 175 | 216 | 219 | 260 | 263 |  |
| A9 | 5 | 2 | 49 | 46 | 93 | 90 | 137 | 134 | 181 | 178 | 225 | 222 | 269 | 266 |
| A10 | 11 | 8 | 55 | 52 | 99 | 96 | 143 | 140 | 187 | 184 | 231 | 228 | 275 | 272 |
| A11 | 17 | 14 | 61 | 58 | 105 | 102 | 149 | 146 | 193 | 190 | 237 | 234 | 281 | 278 |
| A12 | 23 | 20 | 67 | 64 | 111 | 108 | 155 | 152 | 199 | 196 | 243 | 240 | 287 | 284 |
| A13 | 29 | 26 | 73 | 70 | 117 | 114 | 161 | 158 | 205 | 202 | 249 | 246 | 293 | 290 |
| A14 | 35 | 32 | 79 | 76 | 123 | 120 | 167 | 164 | 211 | 208 | 255 | 252 | 299 | 296 |
| A15 |  | 38 | 41 | 82 | 85 | 126 | 129 | 170 | 173 | 214 | 217 | 258 | 261 |  |
| A16 | 3 |  | 47 | 44 | 91 | 88 | 135 | 132 | 179 | 176 | 223 | 220 | 267 | 264 |
| A17 | 9 | 6 | 53 | 50 | 97 | 94 | 141 | 138 | 185 | 182 | 229 | 226 | 273 | 270 |
| A18 | 15 | 12 | 59 | 56 | 103 | 100 | 147 | 144 | 191 | 188 | 235 | 232 | 279 | 276 |
| A19 | 21 | 18 | 65 | 62 | 109 | 106 | 153 | 150 | 197 | 194 | 241 | 238 | 285 | 282 |
| A20 | 27 | 24 | 71 | 68 | 115 | 112 | 159 | 156 | 203 | 200 | 247 | 244 | 291 | 288 |
| A21 | 33 | 30 | 77 | 74 | 121 | 118 | 165 | 162 | 209 | 206 | 253 | 250 | 297 | 294 |
| A22 | 39 | 36 | 83 | 80 | 127 | 124 | 171 | 168 | 215 | 212 | 259 | 256 |  | 300 |

The Address Select lines are sequentially turned on via TAB head assembly interface circuitry according to a firing order counter located in the printer and sequenced (independently of the data directing which resistor is to be energized) from A1 to A22 when printing form left to right and from A22 to A1 when printing from right to left. The print data retrieved from the printer memory turns on any resistor firing frequency is shown as F in FIG. 16. A brief rest period of approximately ten percent of the period, 1/F is allowed between cycles. This rest period prevents Address Select cycles from overlapping due to printer carriage velocity variations.

The interconnections for controlling the TAB head assembly driver circuitry include separate primitive select and primitive common interconnections. The driver circuity of the preferred embodiment comprises an array of fourteen primitives, fourteen primitive commons, and twenty-two address select lines, thus requiring 50 interconnections to control 300 firing resistors. The integration of both heater resistors and FET driver transistors onto a common substrate creates the need for additional layers of conductive circuitry on the substrate so that the transistors could be electrically connected to the resistors and other components of the system. This creates a concentration of heat generation within the substrate.

Figure 17:
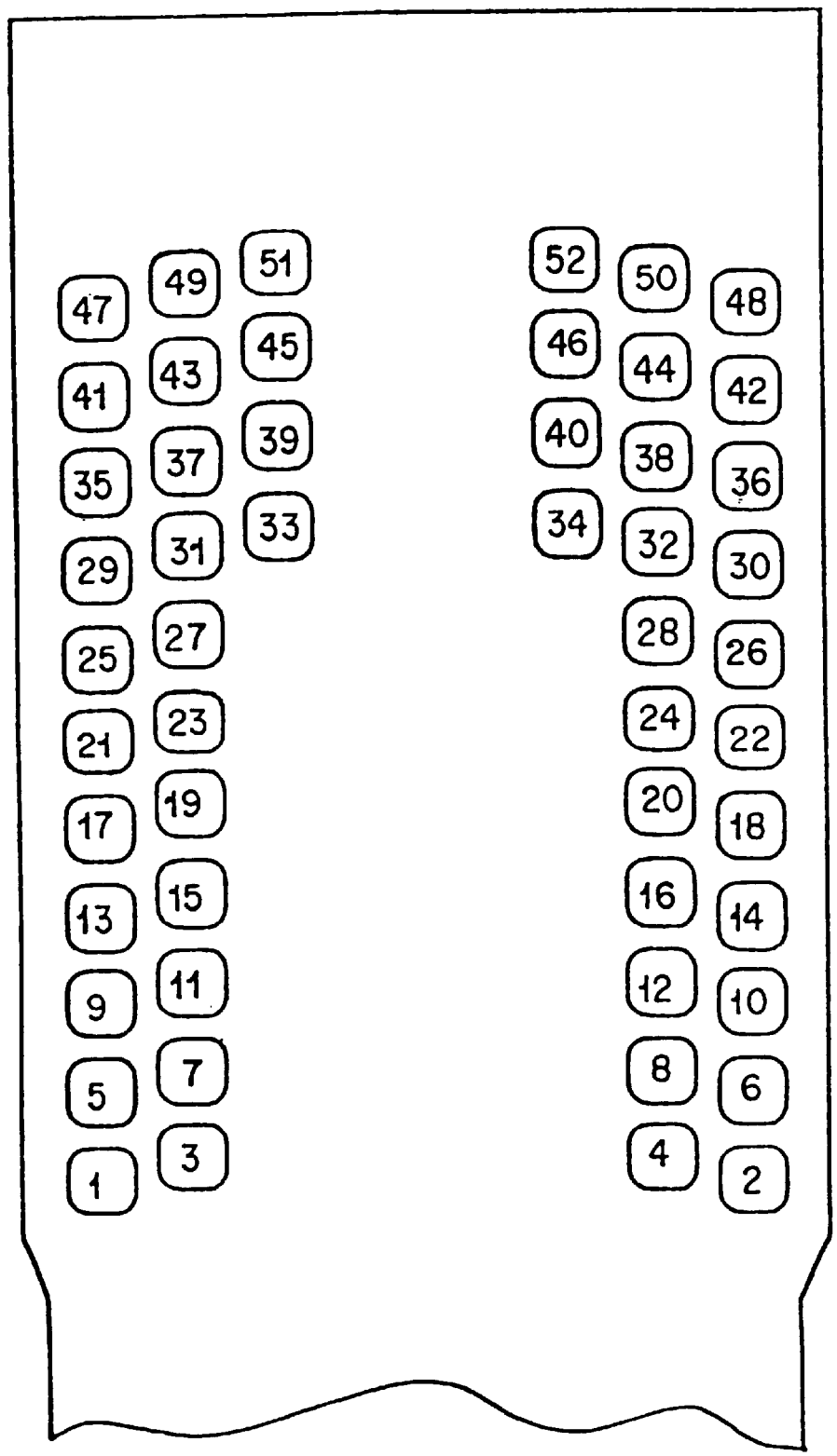
FIG. 17 is a diagram showing the layout of the contact pads on the TAB head assemble.

Referring to FIGS. 1 and 2, the print cartridge 10 is designed to be installed in a printer so that the contact pads 20, on the front surface of the flexible circuit 18, contact printer electrodes which couple externally generated energization signals to the TAB head assembly. To access the traces 36 on the back surface of the flexible circuit 18 from the front surface of the flexible circuit, holes (vias) are formed through the front surface of the flexible circuit to expose the ends of the traces. The exposed ends of the traces are then plated with, for example, gold to form the contact pads 20 shown on the front surface of the flexible circuit in FIG. 2. In the preferred embodiment, the contact or interface pads 20 are assigned the functions listed in Table II. FIG. 17 shows the location of the interface pads 20 on the TAB head assembly of FIG. 2.

TABLE 11

ELECTRICAL PAD DEFINITON

| Odd Side of Head | | | Even Side of Head | | |
|---|---|---|---|---|---|
| Pad# | Name | Function | Pad# | Name | Function |
| 1 | A9 | Address Select 9 | 2 | G6 | Common 6 |
| 3 | PS7 | Primitive Select 7 | 4 | PS6 | Primitive Select 6 |
| 5 | G7 | Common 7 | 6 | A11 | Address Select 11 |
| 7 | PS5 | Primitive Select 5 | 8 | A13 | Address Select 13 |
| 9 | G5 | Common 5 | 10 | G4 | Common 4 |
| 11 | G3 | Common 3 | 12 | PS4 | Primitive Select 4 |
| 13 | PS3 | Primitive Select 3 | 14 | A15 | Address Select 15 |
| 15 | A7 | Address Select 7 | 16 | A17 | Address Select 17 |
| 17 | A5 | Address Select 5 | 18 | G2 | Common 2 |
| 19 | G1 | Common 1 | 20 | PS2 | Primitive Select 2 |
| 21 | PS1 | Primitive Select 1 | 22 | A19 | Address Select 19 |
| 23 | A3 | Address Select 3 | 24 | A21 | Address Select 21 |
| 25 | A1 | Address Select 1 | 26 | A22 | Address Select 22 |
| 27 | TSR | Thermal Sense | 28 | R10X | 10X Resistor |
| 29 | A2 | Address Select 2 | 30 | A20 | Address Select 20 |
| 31 | A4 | Address Select 4 | 32 | PS14 | Primitive Select 14 |
| 33 | PS13 | Primitive Select 13 | 34 | G14 | Common 14 |
| 35 | G13 | Common 13 | 36 | A18 | Address Select 18 |
| 37 | A6 | Address Select 6 | 38 | A16 | Address Select 16 |
| 39 | A8 | Address Select 8 | 40 | PS12 | Primitive Select 12 |
| 41 | PS11 | Primitive Select 11 | 42 | G12 | Common 12 |
| 43 | G11 | Common 11 | 44 | G10 | Common 10 |
| 45 | A10 | Address Select 10 | 46 | PS10 | Primitive Select 10 |
| 47 | A12 | Address Select 12 | 48 | G8 | Common 8 |
| 49 | PS9 | Primitive Select 9 | 50 | P58 | Primitive Select 8 |
| 51 | G9 | Common 9 | 52 | A14 | Address Select 14 |

Figure 18:
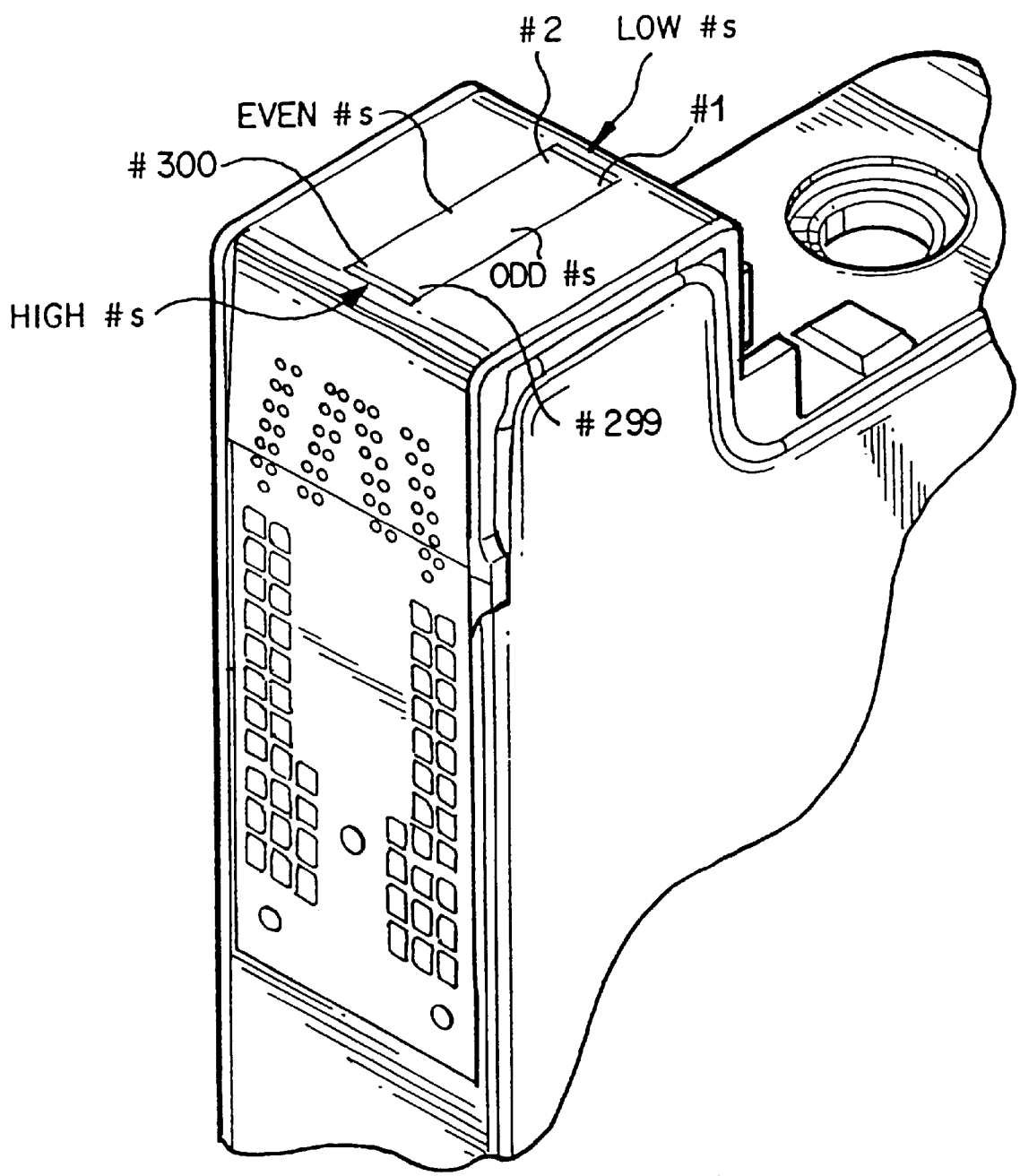
FIG. 18 is a magnified perspective view showing a THA mounted on a print cartridge.

FIG. 18 shows the relative positions of the even # nozzles 2 through 300 and the odd # nozzles 1 through 299 when the THA is mounted on a print cartridge.

Figure 19:
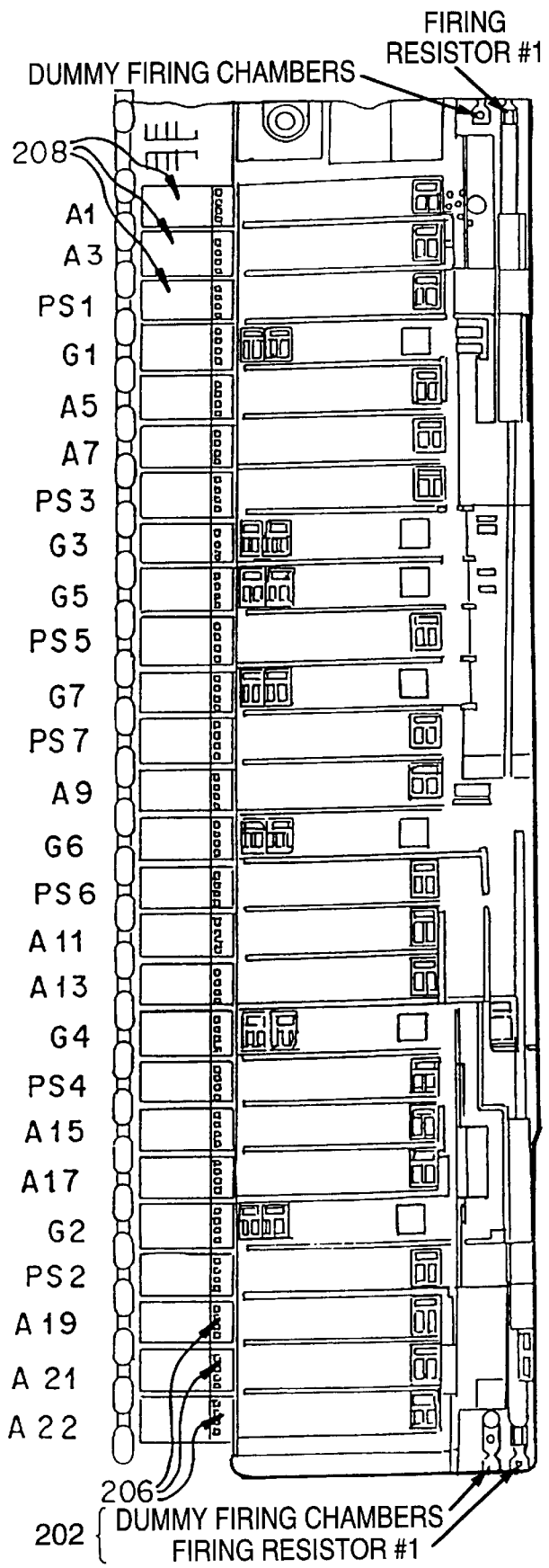
FIG. 19 shows one end of a substrate with firing resistors #1 and #2, with the interconnects identified.
Figure 20:
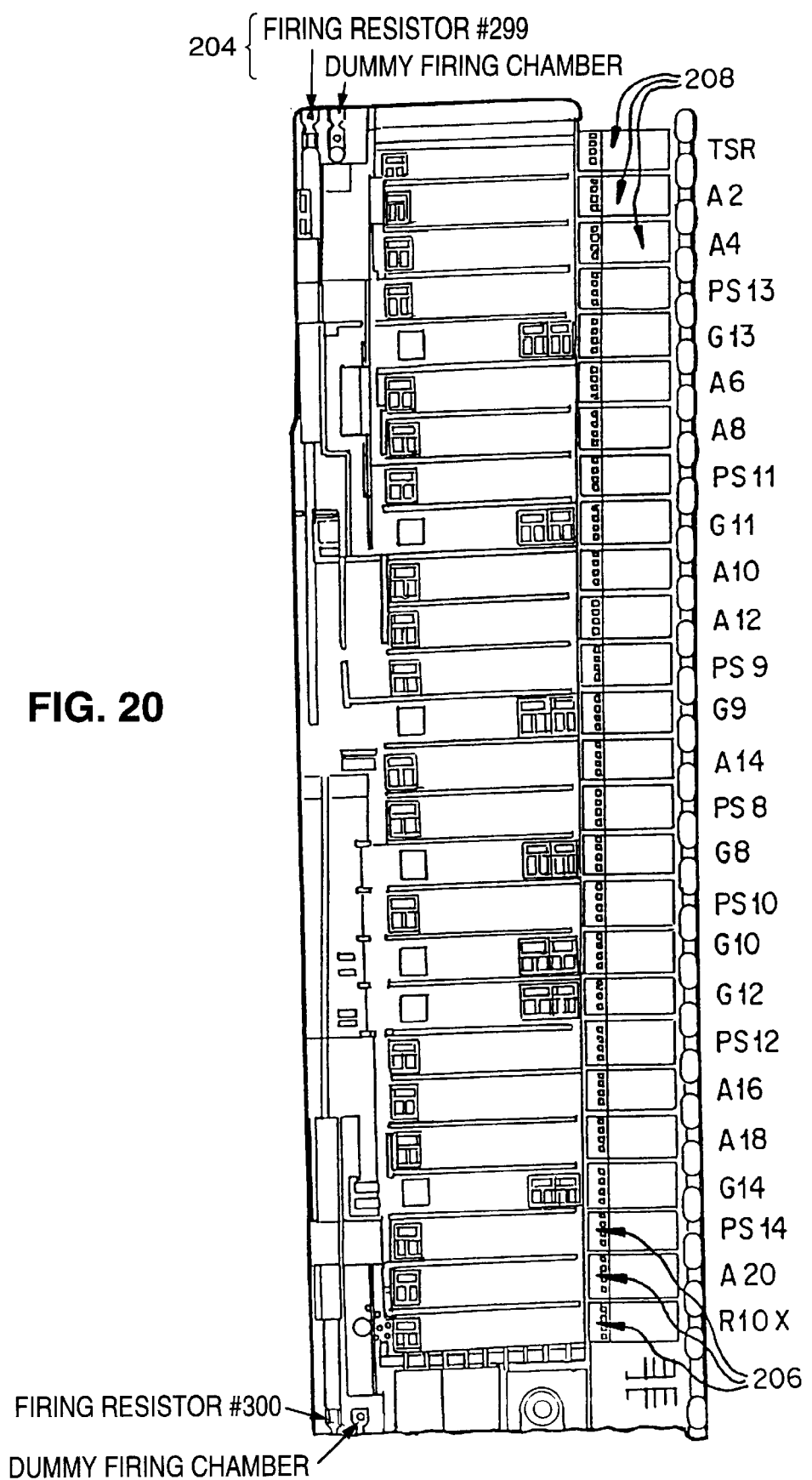
FIG. 20 shows the opposite end of the substrate of FIG. 19, with firing resistors #299 and #300, with the interconnects identified.

FIGS. 19–20 are an enlarged illustration of both truncated end portions 202, 204 of the substrate showing the ESD devices 206 and the interconnect junctions 208.

FIGS. 21–22 includes schematic drawings as well as related data tables showing the dimensions, electrical resistance and identification of the various circuitry portions of the substrate. It will be appreciated by those skilled in the art that substantial heat is generated by all of the circuitry on the substrate. More particularly, each firing resistor requires 300 milliamps whenever it is selected for firing. For a 12 KHertz firing frequency of F, and in reference to the firing diagram of FIG. 16, when all of the twenty-two address lines are activated in a duty cycle with each pulse width being 2.3 microseconds, then 2.3×22 equals a result divided by 83 microseconds to create a 61% duty cycle. Therefore it is possible when all primitives are firing at the same time to pass a current of approximately 25 amps through the substrate (300 milliamps×14×0.61). The cooling characteristics of the edge feed design are therefore very helpful in avoiding the overheating of the substrate during normal operation.

Also, in the present design it was the required width of the interconnects which determined the maximum width of the substrate, thereby making the multiplexing on the substrate very important in order to provide only 52 interconnects to selectively actuate 300 firing resistors in the vaporization compartments.

Figure 23:
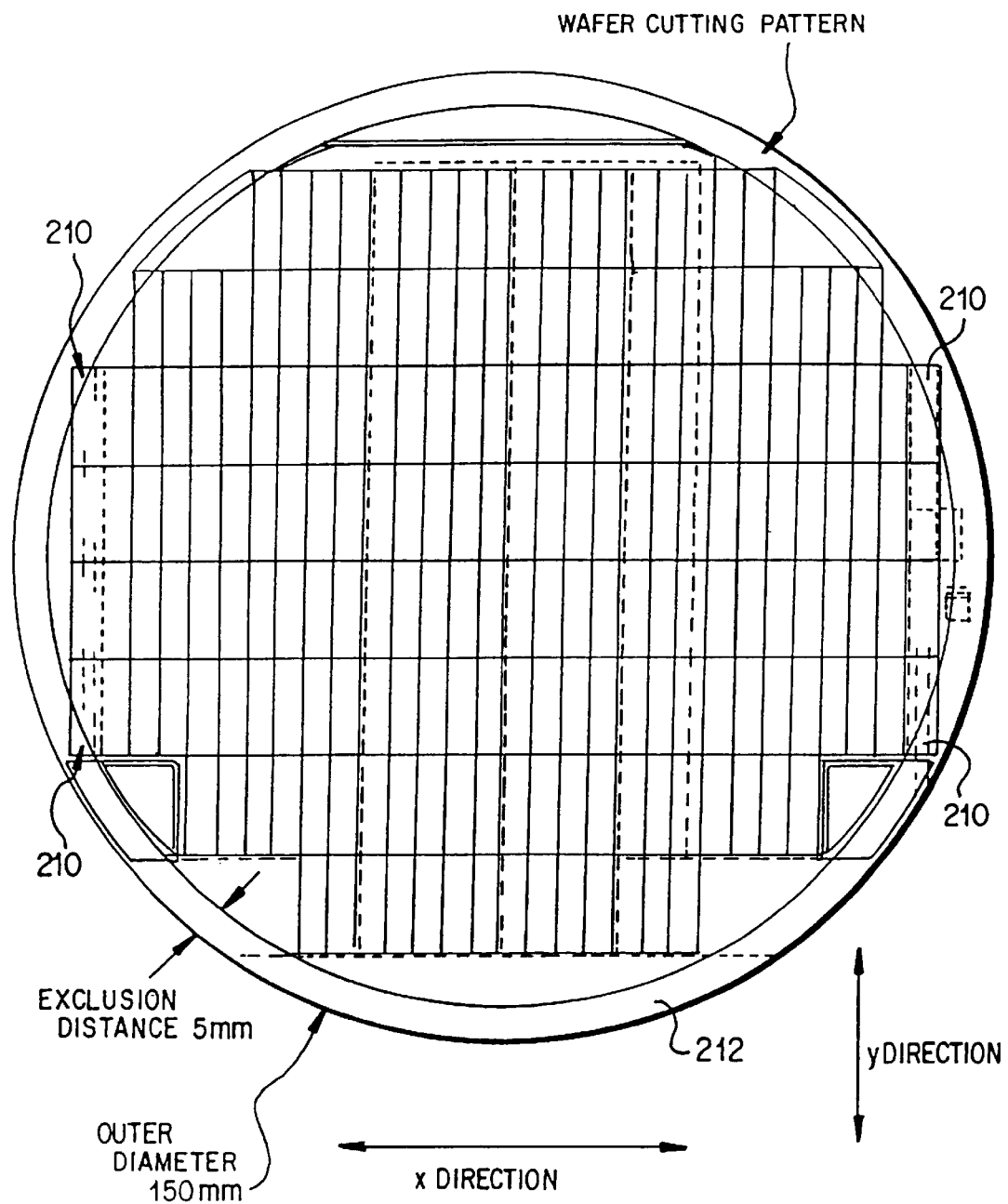
FIG. 23 shows a silicon wafer prior to the individual dies being cut and separated from the wafer.
Figure 24:
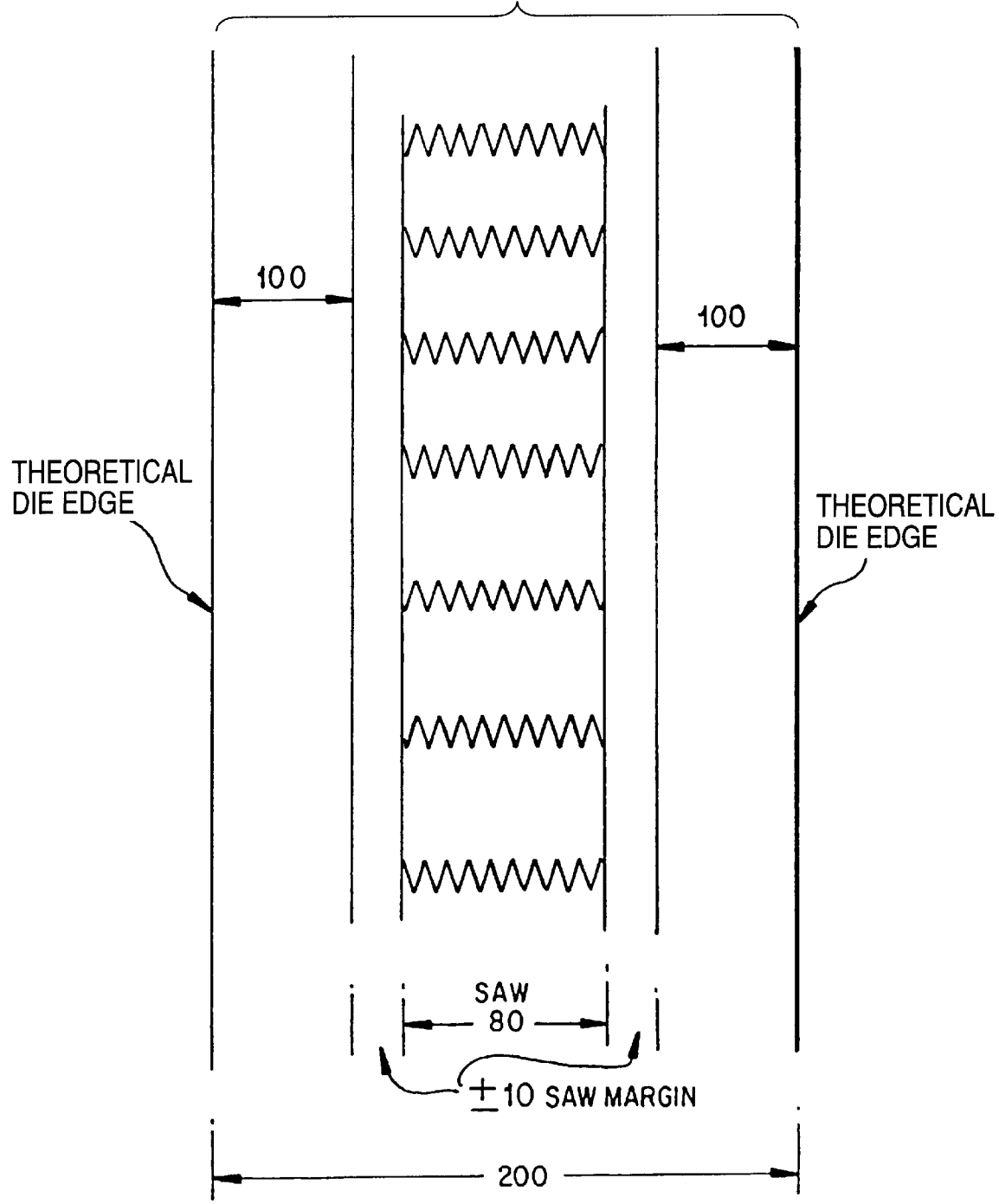
FIG. 24 shows the schematic and data for cutting a silicon wafer into individual dies.

FIGS. 23–24 show the dimensions for cutting a silicon wafer in order to obtain a high yield for the substrate dies of the present invention. Although some of the dies such as 210 which extend into the 5 mm wide exclusion zone 212 are not usable if critical components of the multilayer substrate lie inside such exclusion zone, nevertheless the invention still provides significantly better yield than for an estimated yield for a center feed ink channel design having the same 300 nozzle 600 dpi specifications as the presently preferred embodiment of the present invention.

In the presently preferred embodiment of the invention disclosed herein, we have combined a 600 dpi ½ inch swath black pen with three 300 dpi color pens each generating a swath of approximately ⅓ inch. The high performance black pen is typically used for printing text and other "black only" features, and thus the output quality and throughput of these features is greater. It also improves the output quality of color graphics and color features by teaming with the three lower performance color pens when printing color graphics or color features. The black component of the graphics which is often a large portion of color graphics content is at a higher resolution and thus at a higher output quality level. The larger swath can then be combined with printing algorithms to improve the throughput of color graphics.

Figure 25:
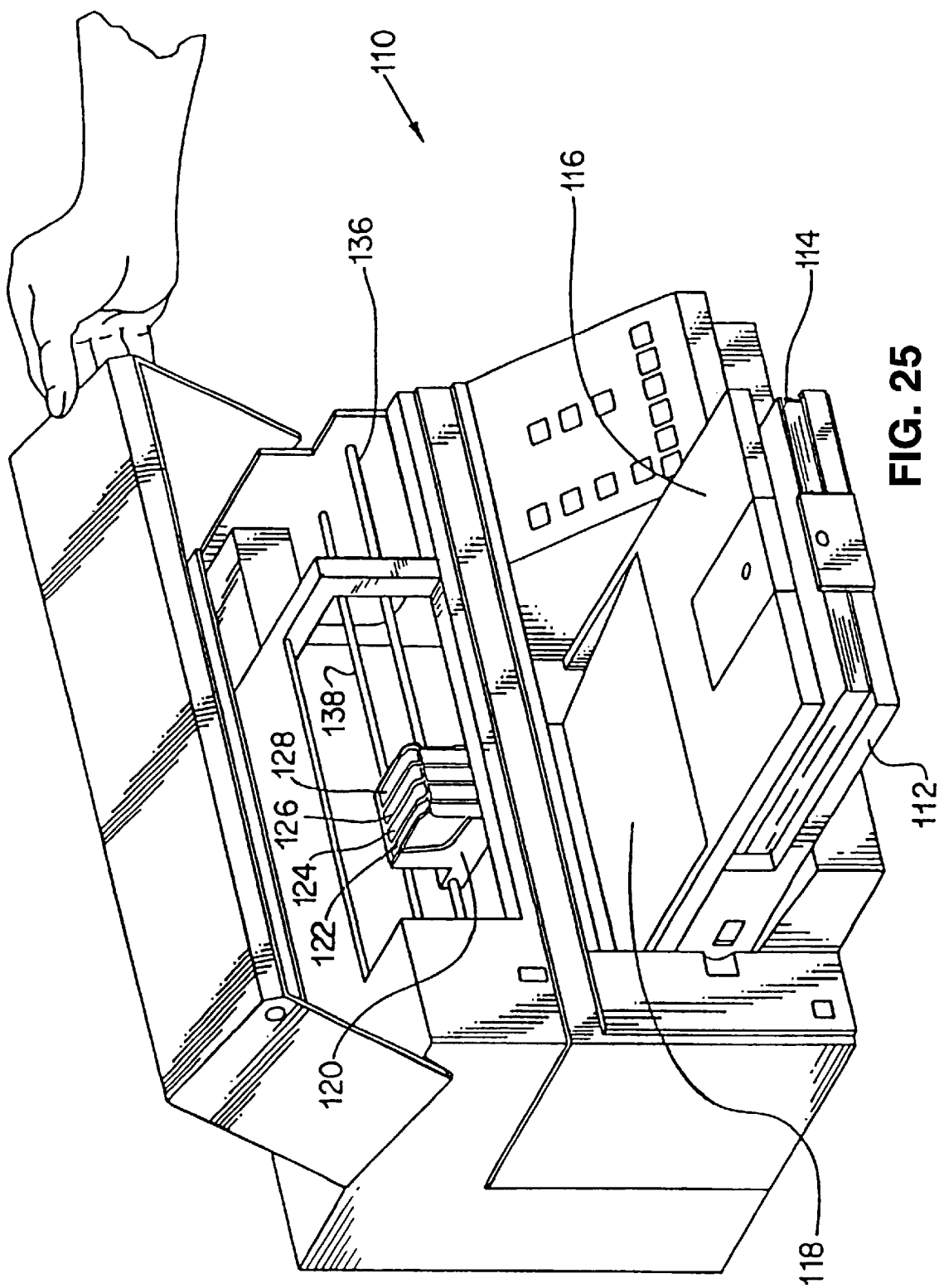
FIG. 25 shows a typical inkjet printer which can incorporate the printhead of the present invention.
Figure 26:
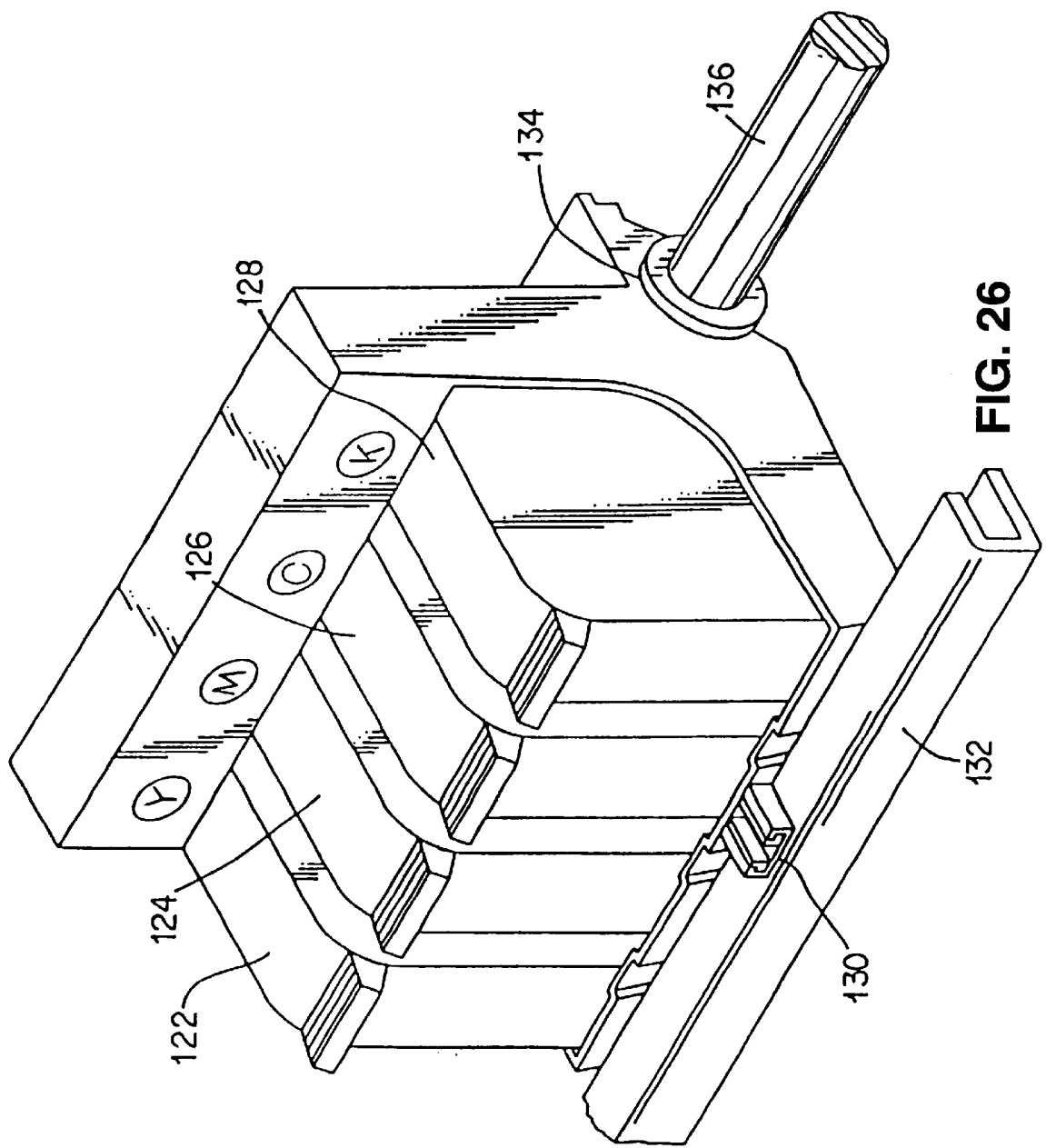
FIG. 26 shows a carriage having removable multi-color print cartridges, which can incorporated the printhead of the present invention.

Even though the invention can be used in any printing environment where text and/or graphics are applied to media using monochrome and/or color comoponents, the presently preferred embodiment of the invention is used in an inkjet printer of the type shown in FIG. 25. In particular, inkjet printer 110 includes an input tray 112 containing sheets of media 114 which pass through a print zone, and are fed past an exit 118 into an output tray 116. Referring to FIGS. 25–26, a movable carriage 120 holds print cartridges 122, 124, 126, and 128 which respectively hold yellow (Y), magenta (M), cyan (C) and black (K) inks. The front of the carriage has a support bumper 130 which rides along a guide 132 while the back of the carriage has multiple bushings such as 34 which ride along slide rod 136. The position of the carriage as it traverses back and forth across the media is determined from an encoder strip 138 in order to be sure that the various ink nozzles on each print cartridge are selectively fired at the appropriate time during a carriage scan.

Figure 27:
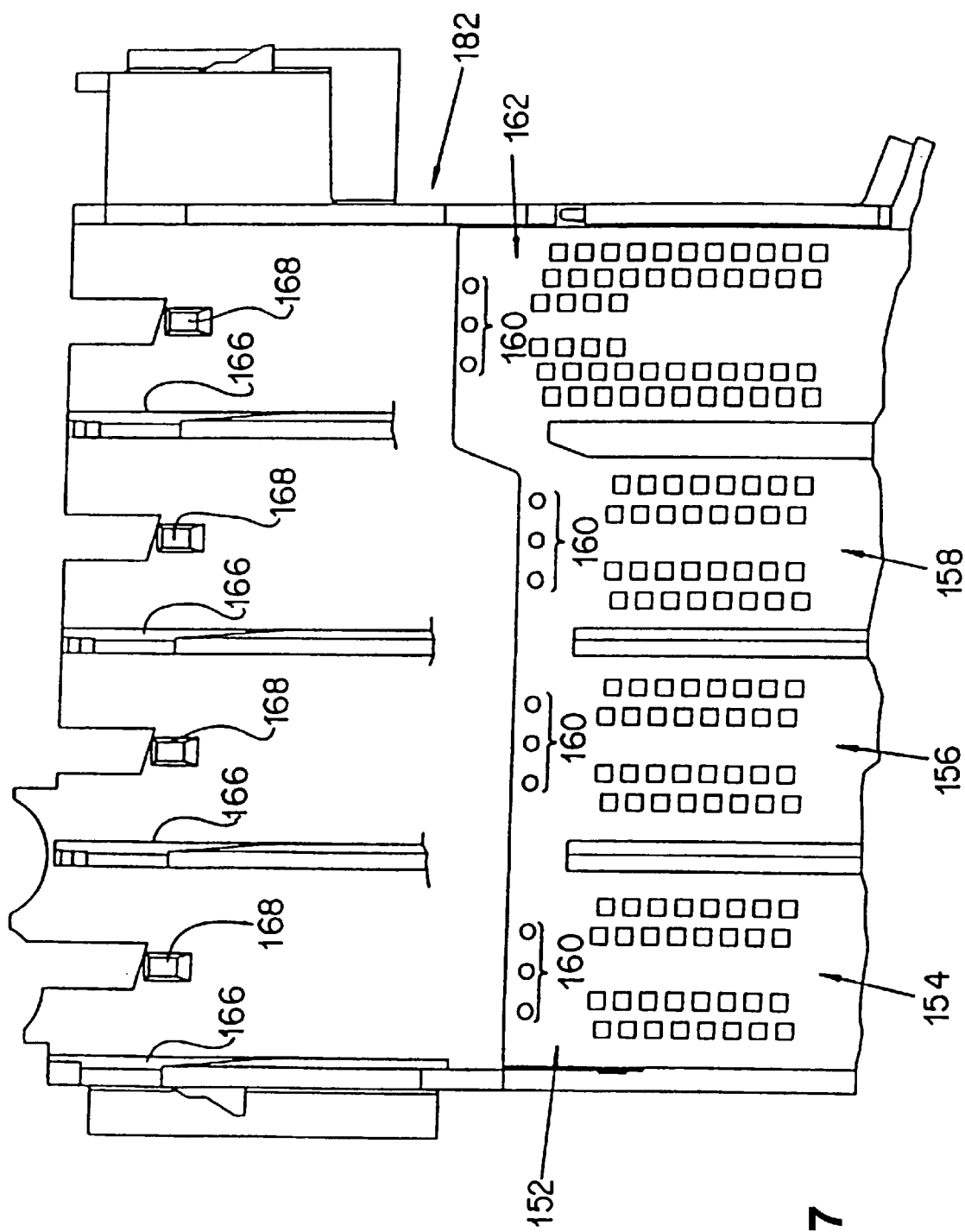
FIG. 27 is a fragmentary view of the flex-circuit interconnect on a carriage with the interior carriage walls cut away.

Referring to FIGS. 26–27, a 300 dpi color inkjet cartridge 140 having a tab-circuit with a four column thirty-two pad electrical interconnect 142 is removably installed in three chutes 144, 146, 148 of a unitary carriage 150. A flex-circuit member 52 having three matching sets of conductive pads 54, 56, 58 is mounted on flex-frame pins 160 for operative engagement with the cartridge pads when the cartridge is inserted into its appropriate chute. An enlarged set of conductive pads 162 covering a larger area, having a different layout, and constituting an array of six columns totaling fifty-two conductive pads on the flex-circuit member is designed for operative engagement with cartridge pads on a 600 dpi black injet cartridge 164.

Figure 28:
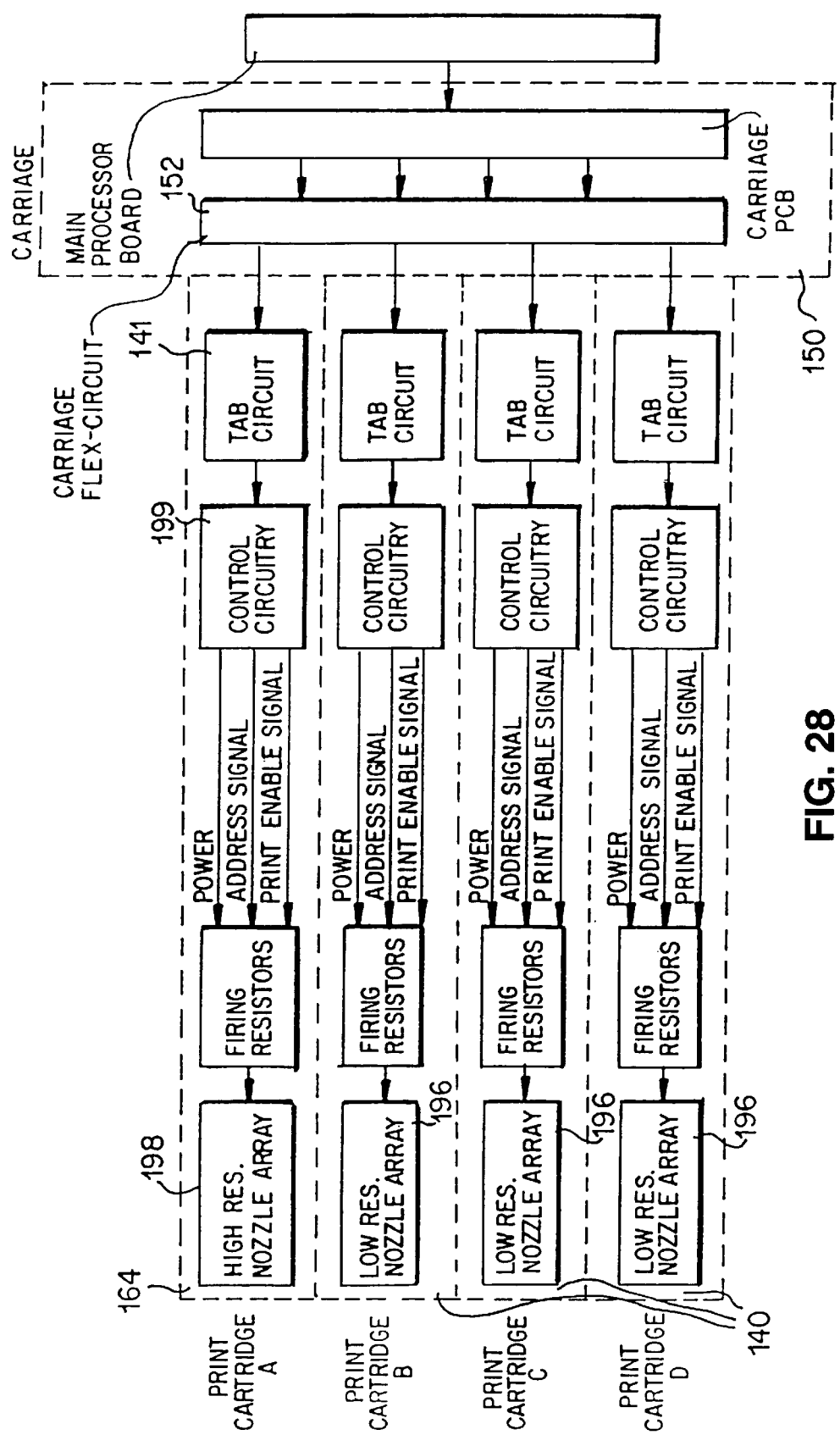
FIG. 28 is a schematic block diagram of the presently preferred printer embodiment of the invention.

FIG. 28 shows the preferred mounting relationship between a 300 dpi nozzle array 196 of the color printheads and a 600 dpi nozzle array 198 of the black printhead. Control circuitry 199 on the substrate enables the three hundred firing resistors of the black printhead to be controlled through fifty-two electrical interconnect jpads, and similary enables all one hundred four firing resistors of each color printhead to be controlled through thirty-two electrical interconnect pads.

This invention allows higher resolution and speed to occur for frequently printed features such as text and the most frequent color components of graphics such as black. Thus by printing these frequent features and components faster and at a higher resolution, the entire page is faster and of higher quality and is more comprable with laser printing performance (8+pages per minute) and laser printing quality (600 dpi resolution).

While specific illustrated embodiments have been shown and described, it will be appreciated by those skilled in the art that various modifications, changes and additions can be made to the methods, structures and apparatus of the invention without departing from the spirit and scope of the invention as set forth in the following claims.

We claim as our invention:

1. A printhead having an array of ink nozzles aligned respectively over a plurality of firing chambers, comprising:

a die substrate including truncated end portions with a column of the firing chambers located on said substrate between said truncated end portions, with said firing chambers positioned to be a predetermined distance apart from each other and extending in a longitudinal direction along at least one outside edge of said substrate;

ink channel means connecting with said firing chambers, for passing ink from an underside of said substrate upwardly around said at least one outside edge of said substrate to said firing chambers; and a print cartridge for supporting said substrate in a fixed position, said print cartridge including end support means for supporting and engaging said truncated end portions of said substrate to allow said ink to flow around said at least one outside edge and into said firing chambers, said end support means including a support surface including a central peninsula for engaging an underside of said truncated end portions and an underside of an interior portion of said substrate, said interior portion located intermediate of said truncated end portions.

2. The printhead of claim 1 wherein said substrate includes a first column of said firing chambers extending in the longitudinal direction along a first edge of said substrate, and a second column of said firing chambers extending in the longitudinal direction along a second edge of said substrate opposite said first edge; and said ink channel means further including first ink channel means for passing ink from an underside of said substrate around said first edge of said substrate to said first column of said firing chambers, and second ink channel means for passing ink from an underside of said substrate around said second edge of said substrate to said second column of said firing chambers.

3. The printhead of claim 1 wherein said end support means includes a raised wall to limit the movement of said truncated end portions in the longitudinal direction.

4. The printhead of claim 3 wherein said raised wall is adjacent to groove means for receiving adhesive to facilitate fixedly attaching said truncated end portions of said substrate to said print cartridge.

5. The printhead of claim 1 wherein said substrate further includes a column of said firing chambers which are less than 1/300th of an inch apart from each other in the longitudinal direction.

6. The printhead of claim 5 wherein said substrate further includes a column of said firing chambers extending in a longitudinal direction a predetermined distance which is greater than one-third of an inch.

7. The printhead of claim 1 wherein said substrate further includes a column of said firing chambers which are less than 1/500th of an inch apart from each other in the longitudinal direction.

8. The printhead of claim 7 which further includes a column of said firing chambers extending in a longitudinal direction as predetermined distance which is at least one-half of an inch.

9. The printhead of claim 1 wherein said ink channel means includes interior wall portions of said print cartridge.

10. The printhead of claim 1 wherein said substrate includes circuitry for selectively actuating individual firing chambers, and wherein said truncated end portions include electrostatic discharge devices for said circuitry.

11. The printhead of claim 1 wherein said substrate includes circuitry for selectively actuating individual firing chambers, and wherein said truncated end portions include interconnect junctions for connecting said circuitry to printer interconnect pads on said print cartridge.

12. The printhead of claim 2 wherein said substrate includes a central interior portion located between said truncated end portions as well as between said first and said second columns of firing chambers, said central interior portion excluding said ink channel means in order to provide a stable substrate with structural integrity.

13. The printhead of claim 12 wherein said first column includes a first group of firing chambers which are less than 1/150th of an inch apart from each other in the longitudinal direction, and wherein said second column includes a second group of firing chambers which are less than 1/150th of an inch apart from each other in the longitudinal direction.

14. The printhead of claim 13 wherein said substrate includes said first and second columns which together extend a total of at least one-half inch in the longitudinal direction.

15. An inkjet printer comprising:

a frame;

a carriage for traversing across a print zone;

a print cartridge removably mounted in said carriage, and including an array of ink nozzles which provide a predetermined swath width;

a die substrate supported on said print cartridge in a fixed position, and including truncated end portions with a column of firing chambers located on said substrate between said truncated end portions, with said firing chambers positioned to be a predetermined distance apart from each other and extending in a longitudinal direction along at least one outside edge of said substrate;

ink channel means connecting with said firing chambers, for passing ink from an underside of said substrate upwardly around said at least one outside edge of said substrate to said firing chambers; and wherein said substrate includes a central interior portion located between said truncated end portions as well as between said first and said second columns of firing chambers, said central interior portion excluding said ink channel means in order to provide a stable substrate with structural integrity.

16. The inkjet printer of claim 15 wherein said print cartridge includes a nozzle array having a predetermined swath width greater than one-third of an inch, and wherein said substrate in said firing chambers positioned to be a predetermined distance apart from each other of less than 1/300th of an inch.

17. A method of achieving increased throughput using a high resolution inkjet printhead, comprising the following steps:

providing an inkjet printhead having one or more columns of firing chambers located on a substrate, with the one or more columns extending together at least one-half inch in a longitudinal direction along at least one outside edge of said substrate;

fixedly attaching the printhead to a print cartridge including affixing only truncated end portions of said substrate directly to said print cartridge;

filling the firing chambers by moving ink from an underside of the substrate around said at least one outside edge of the substrate into the firing chambers;

connecting a firing element in each of the firing chambers through a first interconnect to a cartridge circuit;

connecting the cartridge circuit through a second interconnect to a printer control circuit; and moving the printhead relative to printing media while at the same time selectively activating the firing chambers through the second and first interconnects.

* * * * *